(12) United States Patent
Kenington

(10) Patent No.: US 6,437,644 B1
(45) Date of Patent: Aug. 20, 2002

(54) PREDISTORTER

(75) Inventor: Peter Kenington, Chepstow (GB)

(73) Assignee: Wireless Systems International Limited (GB)

( * ) Notice: Subject to any disclaimer, the term of this patent is extended or adjusted under 35 U.S.C. 154(b) by 0 days.

(21) Appl. No.: 09/623,645

(22) PCT Filed: Mar. 8, 1999

(86) PCT No.: PCT/GB99/00698
§ 371 (c)(1),
(2), (4) Date: Mar. 2, 2001

(87) PCT Pub. No.: WO99/45640
PCT Pub. Date: Sep. 10, 1999

(30) Foreign Application Priority Data

Mar. 6, 1998 (GB) .............................. 9804835

(51) Int. Cl.⁷ ................................. H03F 1/26
(52) U.S. Cl. .................. 330/149; 330/151; 330/136
(58) Field of Search ................ 330/149, 136, 330/151

(56) References Cited

U.S. PATENT DOCUMENTS 3,732,502 A    5/1973   Seidel
4,329,655 A    5/1982   Nojima et al.
5,164,678 A   11/1992   Puri et al.

FOREIGN PATENT DOCUMENTS

DE    2 306 294         2/1973
GB    0 751 614 A1      5/1996
GB    0 678 946 A1      4/1997

Primary Examiner—Robert Pascal
Assistant Examiner—Henry Choe
(74) Attorney, Agent, or Firm—Kilpatrick Stockton LLP

(57) ABSTRACT

A predistorter arrangement for linearising an amplifier. The predistorter arrangement is designed to compensate for IMD distortion in an amplifier using multiple order polynomial approximation techniques. The predistorter arrangement also includes feedback circuitry for controlling the operation of the predistorter.

15 Claims, 26 Drawing Sheets

PREDISTORTER

FIELD OF THE INVENTION

This invention relates to a predistorter arrangement for linearising an amplifier. In particular, the present invention relates to a polynomial predistorter arrangement designed to compensate for IMD distortion in an amplifier using multiple order polynomial approximation techniques.

BACKGROUND OF THE INVENTION

In an ideal system, a linear amplifier provides uniform gain throughout its dynamic range in order that the output signal of the amplifier is a correct, amplified version of the input signal. In reality however all linear amplifiers exhibit non-ideal properties such as amplitude and phase distortion, which are undesirable and can seriously deteriorate the performance of a system. One effect of this non-linearity of the amplifier is the generation of output frequencies equal to the sums and differences of integer multiples of the input frequency components. This effect is known as intermodulation distortion (IMD) and is particularly undesirable in high-power radio frequency (RF) amplifiers designed for use in broadband systems. For example, a broadband amplifier used in the TDMA cellular system will generate various intermodulation products as a result of amplifying a multitude of TDMA channels occurring at fixed frequency intervals across a TDMA band, with coincident active frames.

A number of linearisation techniques have been developed to overcome the above distortion problems associated with a linear amplifier. A few of these techniques operate in real-time to account for time dependent changes in the non-linear characteristics of the amplifier. Such changes may result from, for example, temperature variations in the amplifier, ageing of amplifier components, power supply fluctuations, or, most particularly, changes in the operating point of the amplifier due to a change in the number or power of the input carriers. Of the broadband, RF-based linearisation techniques, the two most commonly used are feed forward linearisation and predistorter linearisation.

A feed forward linearisation mechanism relies on creating an error signal representative of the IMD products introduced by the linear amplifier, and feeding this signal forward to combine with the output spectrum of the amplifier, cancelling out the unwanted distortion. In order for the cancellation process to operate correctly, it is necessary for the mechanism to accurately adjust the amplitude and phase of the error signal prior to combining it with the output of the amplifier. This typically involves the use of additional amplifiers and lossy delay lines and couplers appearing in the output path from the main amplifier. These losses and the requirement for additional amplifiers, which are not adding to the output power of the system, result in a low-efficiency solution.

In general, predistortion linearisation mechanisms involve deliberate alteration of the relatively low level input signal to the amplifier in anticipation of the undesired distortion process occurring within the amplifier. Specifically, the mechanism predistorts the input signal in an inverse sense to the distortion produced by the amplifier such that in series the overall distortion is minimised. Accordingly, the transfer characteristic of the predistorter is approximated as closely as possible to the inverse or complementary function of the transfer characteristic of the amplifier. If the linear amplifier is compressive, i.e. the gain tails off at higher power levels, then the predistorter will compensate for this compression by correspondingly expanding the input signal.

Several approaches exist for predistorting the input signal, each differing in the way the predistorter approximates the inverse or complementary function. One approach approximates the inverse function with the exponential characteristics of a diode. One or more diodes may be used together with appropriate biasing to achieve a reduction of the distortion in the order of 10 dB. A second approach is to perform a piece-wise approximation of the inverse function using a series of linear gain, straight line elements interconnected end-to-end. A drawback with this approach is that the alignment and control of the line elements requires complex circuitry owing to the interconnection points having two degrees of freedom.

Polynomial predistortion is another approach to approximating the inverse function of the amplifier transfer characteristic. It is based on a polynomial expansion of the inverse function which may be expressed as follows:

$$y=a+bx+cx^2+dx^3+ex^4+fx^5+gx^6+hx^7\ldots.$$

The term a is an offset which may be set to zero in a practical polynomial predistorter. The term bx represents the gain of the predistorter which is linear and merely contributes to the gain of the main amplifier. The terms containing even powers of x represent harmonic distortion components generated in the main amplifier which may be removed using frequency filtering, and therefore these terms may also be set to zero. The remaining terms containing odd powers of x represent in-band distortion caused by the main amplifier (in addition to harmonics which can be filtered as above). In fact, each of these odd-power terms may be considered to represent the equivalent order of intermodulation distortion generated in the main amplifier.

According to a first aspect of the present invention there is provided a predistorter arrangement for linearising an amplifier, the predistorter arrangement comprising an input signal path for receiving an input signal which is required to be amplified, a distortion path in which an input signal from the input signal path is processed to generate a distortion signal comprising at least one distortion component which is a third order or higher order component of the input signal, means for combining the distortion signal with the input signal in the input signal path to produce a predistorted input signal which is supplied to the amplifier input, and an error correction means in which the amplifier output signal is compared with the distortion signal from the distortion path to produce error correction signals for controlling the generation of at least one distortion component in the distortion path, wherein, for each distortion component for which an error correction signal is produced, the error correction means compares the distortion component individually with the amplifier output signal to produce the error correction signal for controlling the generation of that distortion component.

Ideally, the error correction means subtracts from the amplifier output signal the input signal from the input signal path prior to comparing the amplifier output signal with the distortion signal.

In a preferred embodiment, the error correction means supplies the input signal subtracted amplifier output signal to a feed forward arrangement. The application describes the combination of a predistorter arrangement and a feed forward arrangement for linearising an amplifier, in which the input signal subtracted amplifier output signal provides the error signal for the feed forward arrangement.

The distortion path preferably includes means for adjusting the distortion signal in dependence on the error correction signal, and the adjustment means may enable adjustment of the distortion signal in phase and amplitude.

In one embodiment, the adjustment means comprises a variable phase shifter and a variable attenuator.

In another embodiment, the adjustment means comprises an in-phase adjustment means and a quadrature phase adjustment means.

Preferably, the correction means correlates the amplifier output signal with the distortion signal to produce the error correction signal.

According to a second aspect of the present invention there is provided a method for linearising an amplifier, including a distortion step in which an input signal which is required to be amplified is processed to generate a distortion signal comprising at least one distortion component which is a third order or higher component of the input signal, a combining step in which the distortion signal is combined with the input signal to produce a predistorted input signal which is supplied to the amplifier input, and an error correction step in which the amplifier output signal is compared with the distortion signal to produce error correction signals which control the generation of at least one distortion component in the distortion step, wherein for each distortion component for which an error correction signal is produced, the error correction step comprises comparing the distortion component individually with the amplifier output signal to produce an error correction signal for controlling the generation of that distortion component.

This application also describes a predistorter arrangement for linearising an amplifier, the predistorter arrangement comprising an input signal path for receiving an input signal which is required to be amplified, and a distortion path in which an input signal from the input signal path is processed to generate a distortion signal, which is combined with the input signal in the input signal path to produce a predistorted input signal which is supplied to the amplifier input, wherein the distortion path processes the input signal to generate at least two different third order or higher order components of the input signal, and includes means for independently adjusting the phase and amplitude of the at least two components.

From another viewpoint, this application describes a device for predistorting an input signal to an amplifier to compensate for distortion errors generated by the amplifier, the device comprising means for receiving an input signal, a main signal path for supplying the input signal to an input of an amplifier, a distortion signal path having means for generating a distortion signal from the input signal, adjustment means for adjusting the amplitude and phase of the distortion signal, and means for adding the distortion signal to the input signal on the main signal path, wherein the device further comprises error signal generating means for coupling to an output of an amplifier and to the main signal path for generating an error signal to control the adjustment means.

Further features and advantages of the invention will be apparent from the description below.

BRIEF DESCRIPTION OF THE DRAWINGS

Embodiments of the invention will now be described, by way of example, with reference to the accompanying drawings, in which.

DETAILED DESCRIPTION OF THE DRAWINGS

Scalar Predistorter

Figure 1:
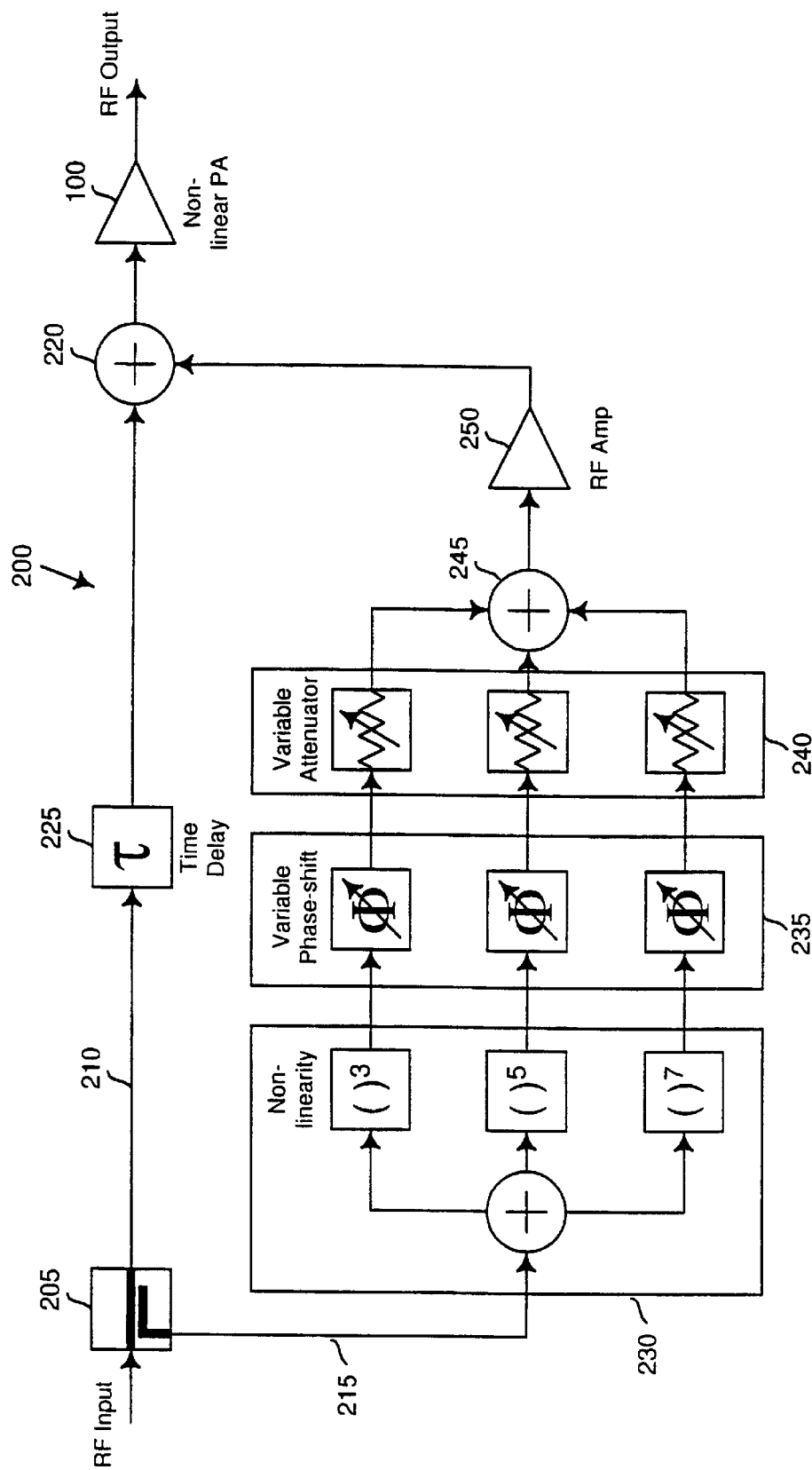
FIG. 1 is a block diagram of a multiple-order scalar polynomial predistorter.

Referring to FIG. 1, there is shown a multiple order polynomial predistorter 200 having an input for receiving an RF input signal and an output for supplying a predistorted signal to an RF power amplifier 100. The RF input signal received at the input of the predistorter is split by the splitter 205 between two channels or paths, the main path 210 supplying the main RF signal for subsequent amplification, and the distortion path 215 supplying multiple orders of distortion for adding to the main RF signal.

The main RF input signal from the main path 210 and the distortion signal from the distortion path 215 are summed in the adder 220 prior to being amplified in the RF power amplifier 100. The main path includes a time delay component 225 to ensure that the main RF signal and the distortion signal coincide at the adder 220. In an ideal operation of the predistorter, the output signal from the RF power amplifier 100 will represent a linearly amplified version of the RF input signal as discussed previously. An example of a possible RF input signal in the form of two closely spaced frequency tones is shown in FIG. 20a.

The RF signal entering the distortion path 215 is fed into a distortion generation circuit 230 which operates on the RF input signal to generate a set of non-linear distortion components each corresponding to a particular order of distortion. In FIG. 1, the orders of distortion generated at the three output paths of the distortion generation circuit 230 are third order, fifth order, and seventh order, illustrated as frequency spectra in FIGS. 20b, 20c and 20d respectively. It is also possible for the distortion generation circuit to generate higher order distortion components such as ninth order, or to generate only third order, or third and fifth order distortion components.

The signals output from the distortion generating circuit 230 are independently adjusted in phase by the set of variable phase-shift components 235 to compensate for any differing phase shifts occurring in the distortion generating circuit 230. The distortion signals are then independently adjusted in amplitude by the set of variable attenuators 240. The amplitude adjustment ensures that the relative levels of the separate distortion components are set to correctly correspond to the relative levels of the orders of distortion generated intrinsically in the RF power amplifier 100.

The correctly adjusted signals representing the third, fifth and seventh orders of distortion are then summed in the adder 245 to produce a single multiple order distortion signal. This signal is fed into an RF amplifier 250 which controls the level of the multiple order distortion signal relative to the main RF signal on the main path 210.

As discussed previously, a predistorter operates by pre-distorting an input signal in an inverse sense to the distortion produced by the amplifier. In the predistorter of FIG. 1, higher order distortion components are added in-phase to the input signal to cancel corresponding distortion generated within the amplifier. This assumes that the distortion signals generated in the amplifier are also in-phase with the signal being amplified, ie the distortion results from a predominantly amplitude modulation to amplitude modulation (AM-AM) transfer characteristic in the amplifier. Accordingly, the predistorter of FIG. 1 may be referred to as a scalar predistorter.

There is however another distortion generating effect associated with power amplifiers which results from an amplitude modulation to phase modulation (AM-PM) transfer characteristic in the amplifier. This form of distortion is characterised by phase variations in the amplified signal which are dependent on the amplitude variations of the input signal.

A scalar predistorter will only be able to linearise an amplifier using AM-AM compensation to a point where the AM-PM distortion becomes dominant over the AM-AM distortion. For amplifiers with a small amount of AM-PM conversion, such as high-quality class-A amplifiers, this is generally not a problem. However, problems can occur in situations where the magnitude of AM-PM distortion in a amplifier is comparable with the magnitude of AM-AM distortion, or where it is required to have a high degree of linearisation in the predistorter/amplifier combination, in which situations a scalar predistorter will operate less effectively. In a class-C amplifier, for example, the AM-PM distortion is usually of a similar magnitude to the AM-AM distortion, and consequently a scalar predistorter will show little or no improvement in the amplifier linearity. Similarly, in the situation where a scalar predistorter uses a fifth order polynomial approximation or higher, the improvement in the AM-AM compensation may not be mirrored by a corresponding improvement in the amplifier linearity due to an overpowering AM-PM distortion.

The combination of the AM-AM and AM-PM transfer characteristics of an amplifier may be mapped onto an in-phase I transfer characteristic of the amplifier and a quadrature phase Q transfer characteristics of the amplifier. A predistorter which generates inverse distortion components individually in each of the I and Q channels can therefore compensate for amplifier generated I and Q channel distortion brought about by the non-linear I and Q transfer characteristics of the amplifier. Such a predistorter may be referred to as a vector predistorter, owing to the use of mutually orthogonal I and Q predistorter components which can define a distortion signal vector in signal space.

Vector Predistorter

FIGS. 2 to 6 are block diagrams showing, in accordance with the invention, different forms of vector predistorter which compensate for third, fifth, and seventh order predistortion in both the in-phase I channel and the quadrature phase Q channel. These vector predistorters are modified versions of the scalar predistorter of FIG. 1 and like features are labelled with like references.

Figure 2:
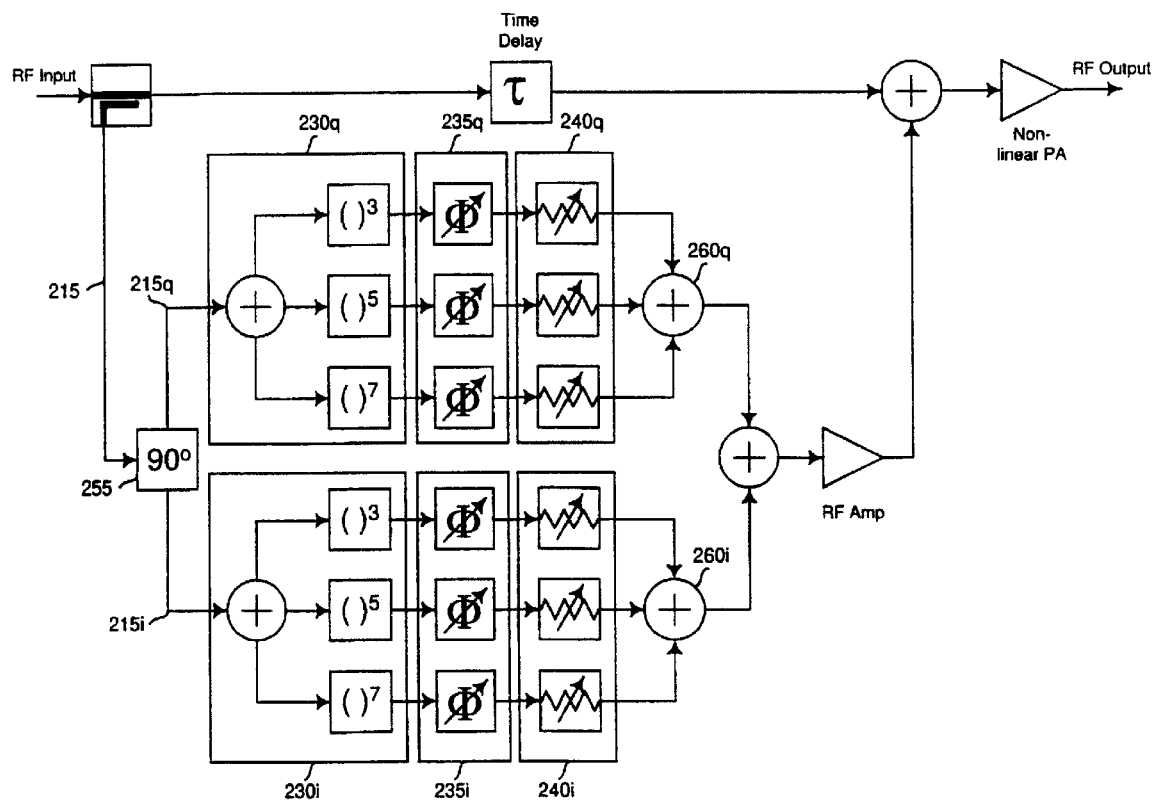
FIGS. 2 to 6 are block diagrams of different forms of multiple-order vector polynomial predistorters.

FIG. 2 shows a vector predistorter in which the RF signal entering the distortion path 215 is split by the phase quadrature component 255 into an in-phase path 215i and a quadrature phase path 215q. Each quadrature path is independently adjusted, as discussed with reference to FIG. 1, to provide at the output of the adder 260i an in-phase multiple order distortion signal and at the output of the adder 260q a quadrature phase multiple order distortion signal.

Figure 3:
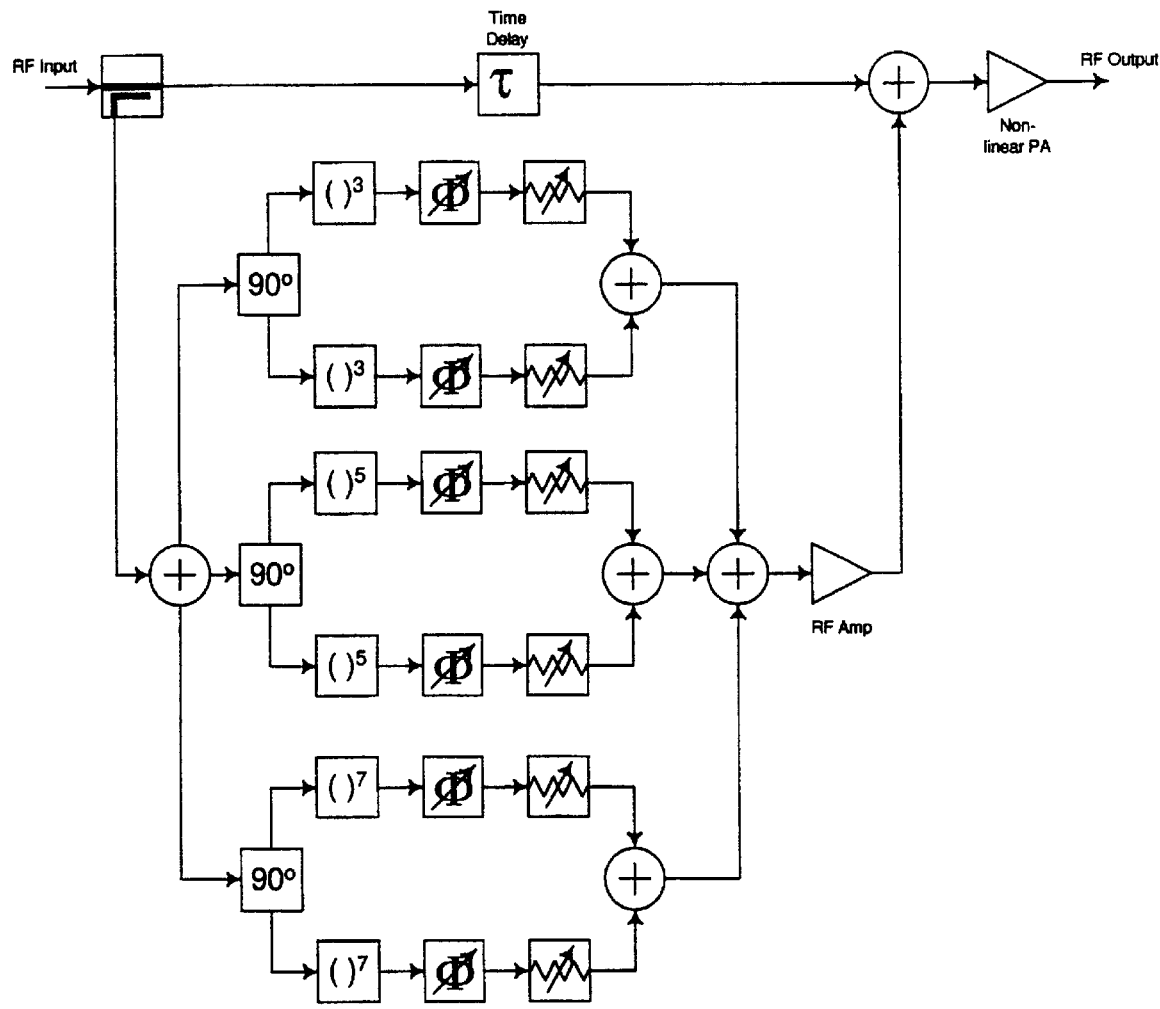
Figure 4:
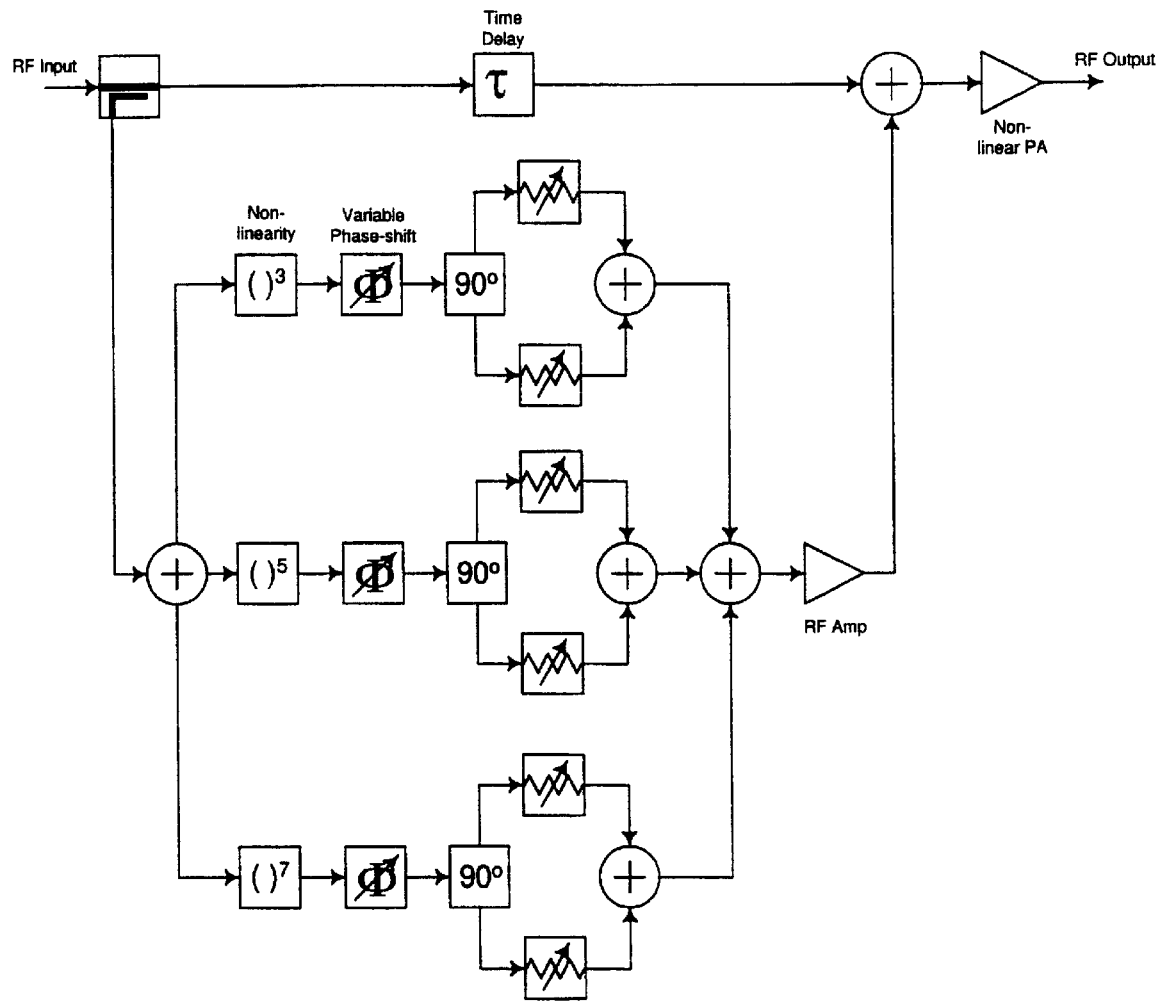

FIG. 3 shows a vector predistorter which is equivalent to the circuit of FIG. 2 except that the in-phase and quadrature phase path separations are nested within the polynomial order path separations. This solution requires an addition of two extra phase quadrature components.

The multitude of variable phase-shift components in the circuits of FIGS. 2 and 3 are inessential to the proper operation of a vector predistorter, as any separate vector information regarding the individual orders of distortion should be provided by the vector modulator structure itself. The circuit of FIG. 3 can therefore be simplified, such that there is only one variable phase-shift component per order of distortion generated, by positioning the phase quadrature components immediately prior to the variable attenuators, as illustrated in the block diagram of FIG. 4.

Figure 5:
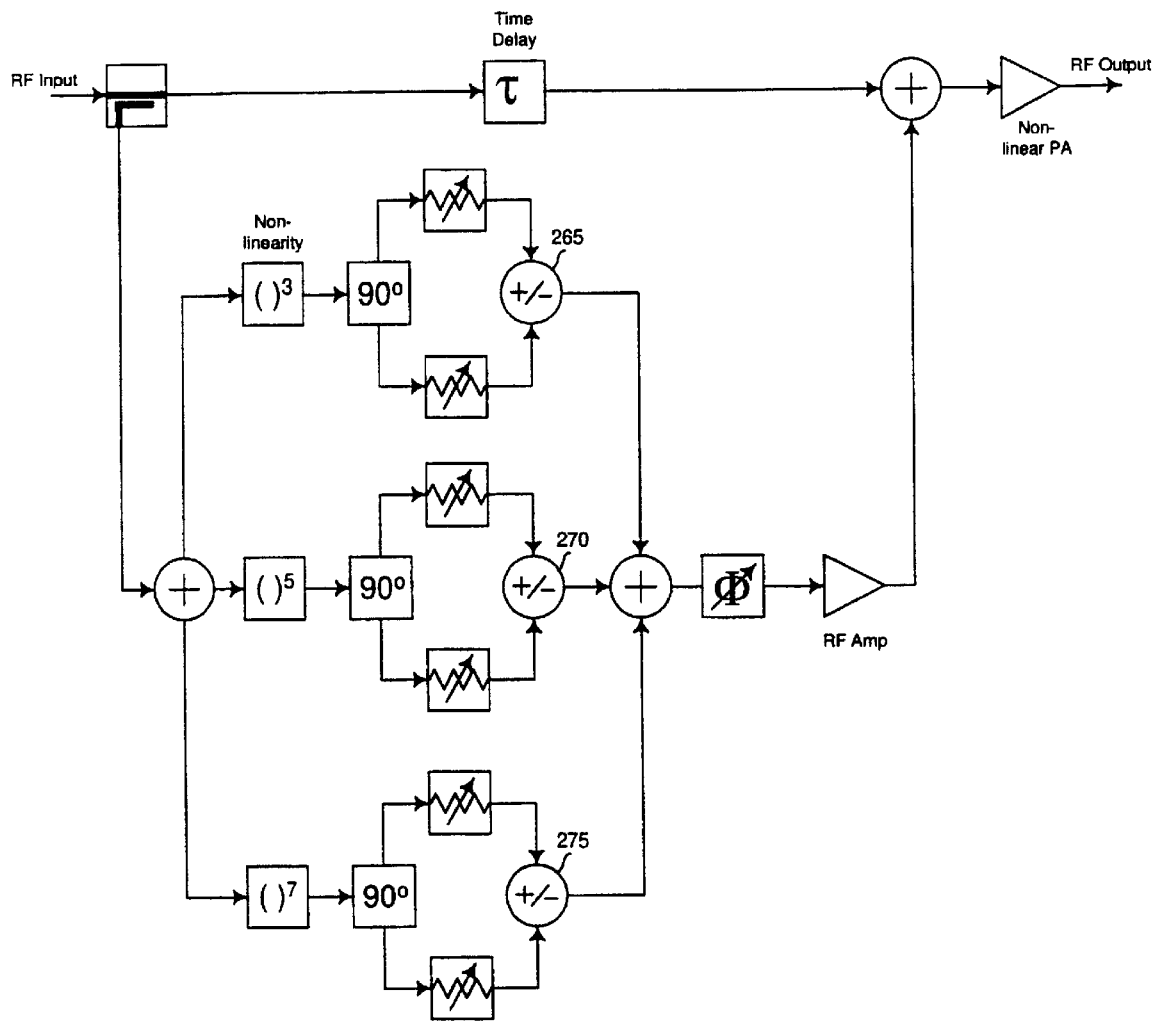

If the set of outputs from the distortion generation circuit, corresponding to the different orders of distortion, are provided in-phase, ie all having equal delay, then a single phase control may be used in the distortion path, see FIG. 5. This single phase control is required simply to ensure that the distortion signal supplied by the RF amp 250 is correctly in phase with the RF input at the adder 105. The circuit of FIG. 5 also includes adders 265, 270, 275 which are able to invert one or both of their inputs to enable the distortion signal vector to fall in any one of four signal space quadrants. Alternatively, a more general solution shown in FIG. 6 replaces the variable attenuators with mixers or multipliers fed with DC control signals to provide a true 360 degree vector modulator in each of the non-linearity orders.

Polynomial Approximations

Figure 7:
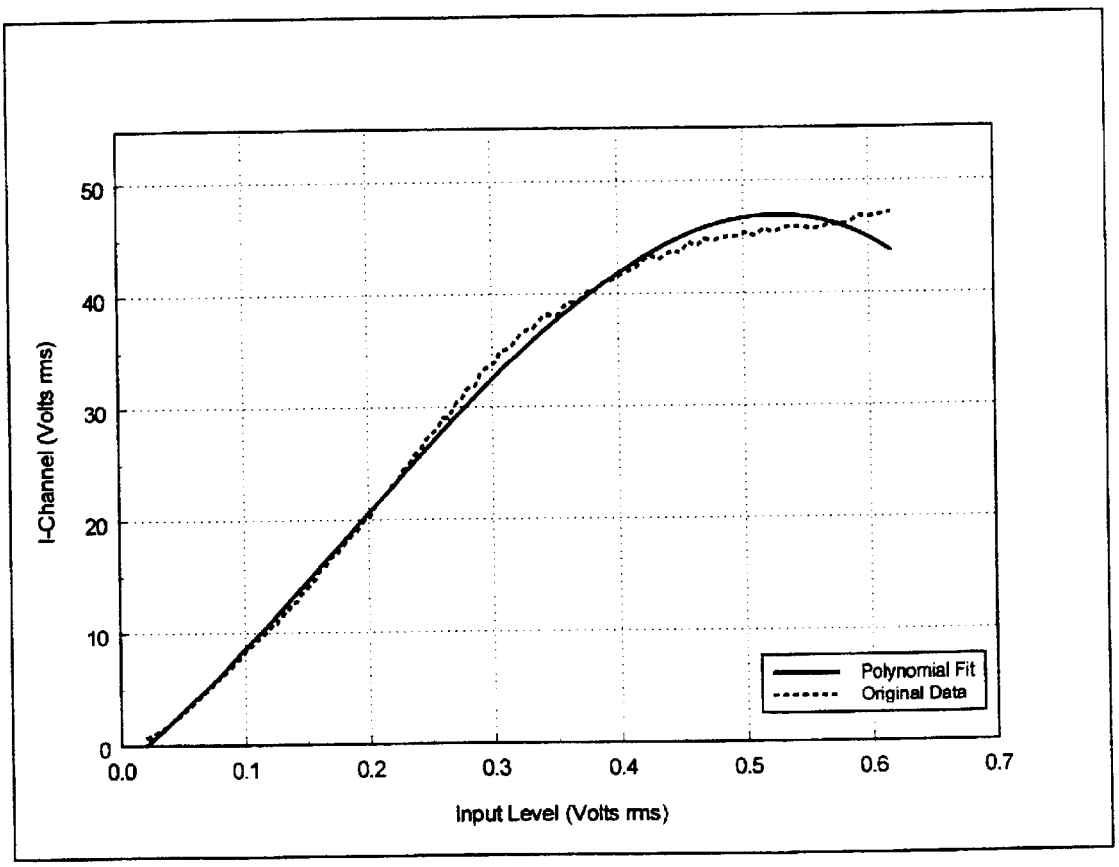
FIG. 7 is a graph showing an I channel transfer characteristic of an amplifier and a third order closest fit approximation.
Figure 8:
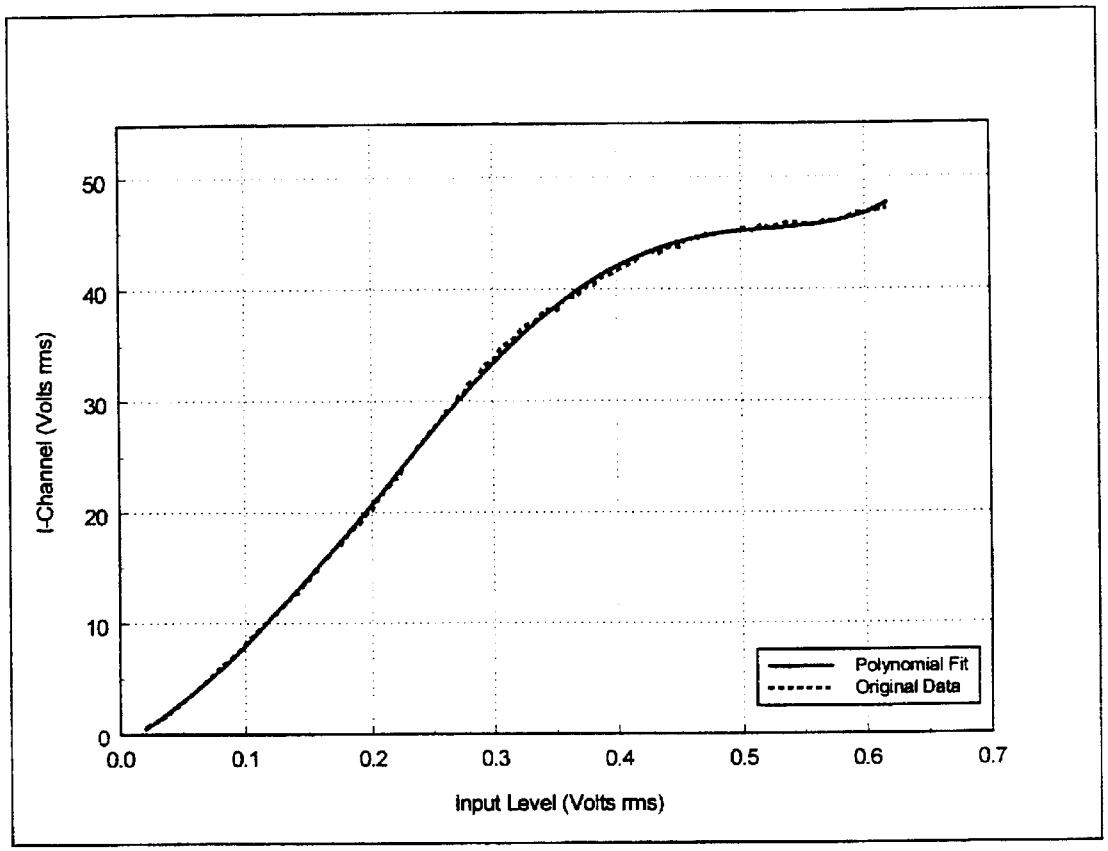
FIG. 8 is a graph showing an I channel transfer characteristic of an amplifier and a fifth order closest fit approximation.
Figure 9:
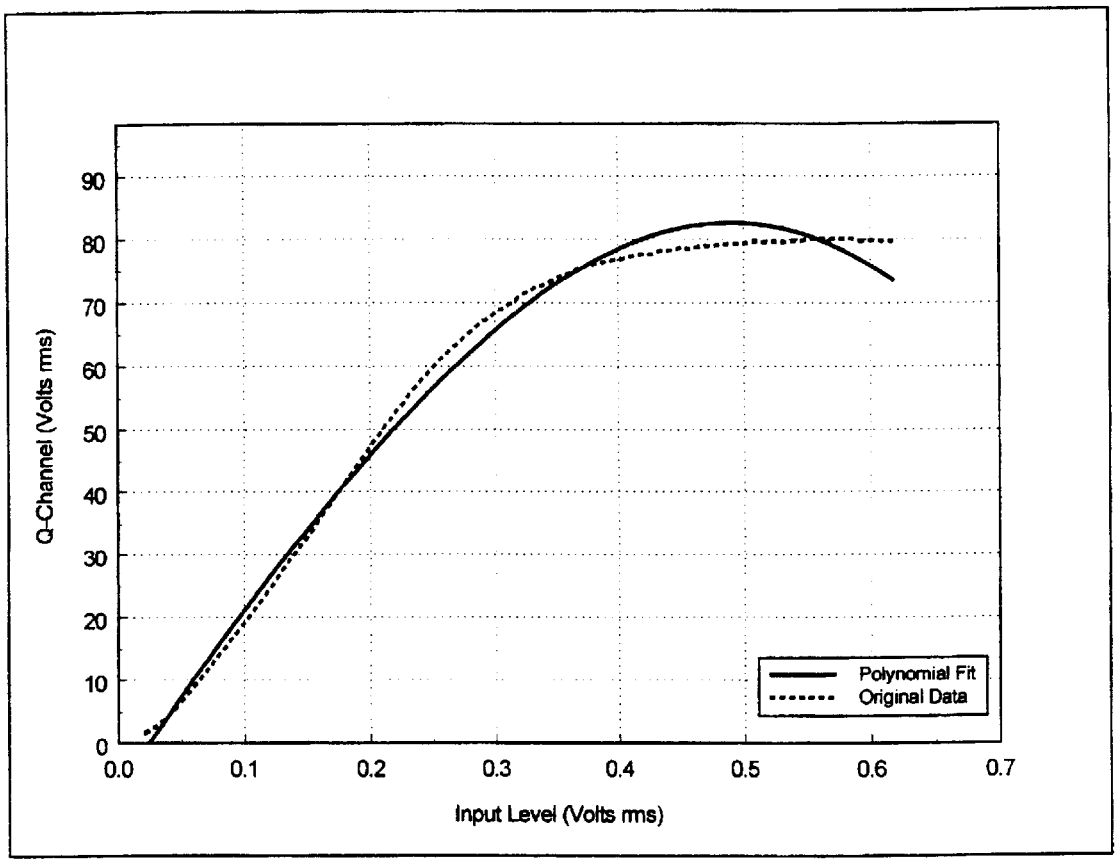
FIG. 9 is a graph showing a Q channel transfer characteristic of an amplifier and a third order closest fit approximation.
Figure 10:
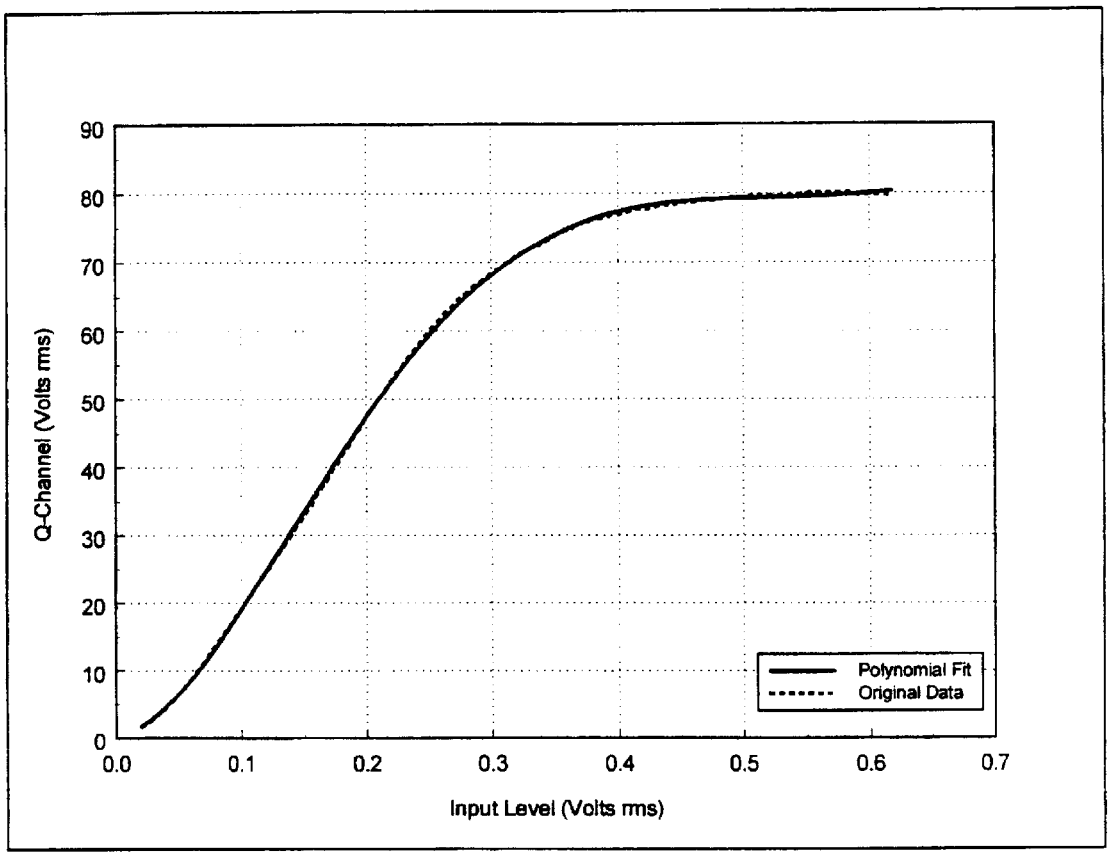
FIG. 10 is a graph showing an Q channel transfer characteristic of an amplifier and a fifth order closest fit approximation.

FIG. 7 shows a graph of an I channel transfer characteristics for a typical amplifier. Superimposed on the graph in FIG. 7 is a closest fit line for the transfer characteristic using a polynomial approximation having component terms up to third order. The coefficients of the component terms of the polynomial approximation are applied inversely in the I channel distortion generation circuit of a third order vector predistorter in accordance with the invention. FIG. 8 shows the same graph for the I channel transfer characteristic together with a closest fit line using a fifth order polynomial approximation. Likewise, the coefficients of the component terms of the polynomial approximation are applied inversely in the I channel distortion generation circuit of a fifth order vector predistorter in accordance with the invention. Clearly, the fifth order approximation provides a more accurate match to the actual properties of the amplifier than the third order approximation. The equivalent graphs for the Q channel are shown in FIGS. 9 and 10. It should be noted that the cubic fit of the I channel in FIG. 7 is quite good, whereas the cubic fit of the Q channel in FIG. 9 is much poorer. The fifth order fits in both cases are better, with the most marked improvement being in the Q channel.

Since many amplifiers have a predominantly fifth order characteristic in one or other of their quadrature characteristics, a vector polynomial predistorter would almost certainly need to be multi-order in order to provide any useful benefit over its single order scalar counterpart.

Distortion Generating Circuits

Different versions of a distortion generation circuit suitable for use in the scalar and vector predistorters of FIGS. 1 to 6 will now be described, with reference to the block diagrams shown in FIGS. 11 to 19, and the frequency spectra in FIG. 20.

Figure 11:
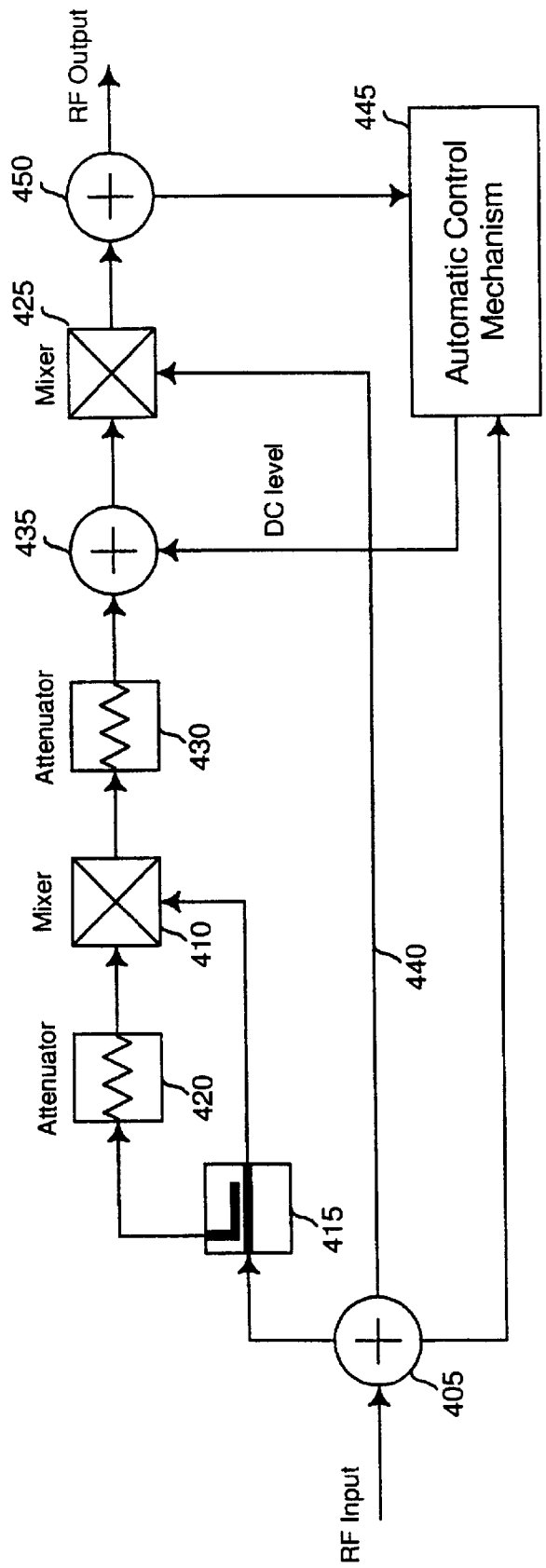
FIG. 11 is a block diagram of circuit for generating a third order distortion component suitable for use in the polynomial predistorters of FIGS. 1 to 6.

FIG. 11 shows a block diagram of a circuit for generating a third order distortion component. The RF input signal entering the circuit is split three ways by the splitter 405. One of the RF signals is then fed into the first input of a mixer or multiplier 410 via a directional coupler 415. The directional coupler samples a portion of the RF signal which is fed into the second input of the mixer 410 via an attenuator 420. By mixing the two versions of the same RF input signal, the output of the mixer 410 ideally generates a squared RF signal which contains frequency components in a DC zone, i.e. at low frequencies, and frequency components in a first harmonic zone, i.e. at double the original frequencies. The frequency spectra of the squared RF signal is represented in FIG. 20e.

The squared RF signal output from the mixer 410 is then fed into the first input of a mixer 425 via an attenuator 430 and a DC injection summer 435. Another RF input signal from the splitter forms the second input to the mixer 425 and may be supplied via a path 440 including a time delay element (not shown) to ensure that the two mixer input signals are in phase. By mixing the squared RF signal with the original RF input signal, the output of the mixer 425 ideally produces a pure cubic signal. The frequency spectra of the cubed RF signal is represented in FIG. 20f (after filtering to eliminate the DC-zone, harmonic and third harmonic components).

The cubed RF signal should, ideally, consist of only input RF signal energy, plus in-band third-order components. In practice however other higher orders of in-band distortion will also be present in the output of the mixer 425, together with more input signal energy than would be expected from a theoretical analysis. The attenuation values for the attenuators 420 and 430, and the coupling factor for the coupler 425 are chosen to optimise performance with the type of mixers 410 and 425. Optimum performance is a compromise between minimising the unwanted input signal energy, caused by leakage through the mixers, and minimising the higher orders of in-band distortion, caused by none-ideal performance of the mixers 410 and 425. In a circuit having a 0 dBm RF input signal level and implementing standard Gilbert-cell based silicon IC mixers, the difference between the "LO", "RF" or "IF" drive levels will typically be in the order of 20 dB in each case.

In a modified version (not shown) of the third order distortion generator circuit of FIG. 11, the squared RF signal output from the mixer 410 is filtered before entering the mixer 425. This enables selection of either the DC zone frequency components of the squared RF signal by means of a low pass filter, or the second harmonic zone frequency components of the squared RF signal by means of a high pass filter. Each selection scheme has its own particular benefits, however, both schemes advantageously provide attenuation of the input tone energy at the output, when used in conjunction with the DC-based input tone rejection mechanism described below.

In the low pass filter version, the selection of the DC zone in practice provides a better behaved response in terms of gain and phase flatness than the second harmonic zone and as a result can provide better coherence between the two third order distortion components shown in FIG. 20b. Although the gain and phase flatness of the second harmonic zone version is effected by the high frequency response of the circuit elements, this version has the benefit of producing an output spectrum in which the input tone level is at a similar level to the third order distortion components, without additional correction.

In order to enable improved control of the third order component generation, it is preferable to remove as much of the input tone energy present in the output as possible. Referring to the circuit of FIG. 11, this is achieved by injecting a DC signal via an adder 435 to the squared RF signal at an appropriate level such that when mixed with the RF input signal the input energy at the output of the circuit is cancelled. The position of the DC signal injection shown in FIG. 11 is preferable as the level of RF input to the mixer 410 is relatively high and is known to a high degree of certainty. The same cancellation of the input energy can however be achieved, albeit less efficiently and less predictably, by injecting a DC signal at other positions in the distortion generation circuit. For example, an alternative position for DC injection could be into the path 440 carrying the RF input signal to the mixer 425. The DC signal would then cancel any leakage of a spurious RF input signal present in the squared RF signal resulting from leakage through the mixer 410. DC signal injection may also be possible in the signal paths leading to the mixer 410.

Although the DC signal level may be set to maximise cancellation of the input signal energy in the output of the distortion generating circuit, fluctuations and drifting of the various signals within the circuit will occur as a result of, for example, temperature variations of circuit components, ageing of circuit components, unpredictable variations in supply voltages, and variations in the level of the input signal(s). The distortion generation circuit therefore includes an automatic control mechanism 445 for initialising, maintaining, and controlling the DC signal at the correct level for maximum cancellation of the input signal energy. The automatic control mechanism operates using a feedback loop principle. The output of the distortion generation circuit is sampled by a splitter 450 and is fed into an input of the control mechanism. A second input of the control mechanism receives an RF input signal from the splitter 405, preferably via a time delay element (not shown), and functions as a reference signal for the RF input. The automatic control mechanism compares the sample from the output with the RF input reference signal, and provides as an output a DC signal level dependent on the level of RF input energy detected in the output sample.

Figure 12:
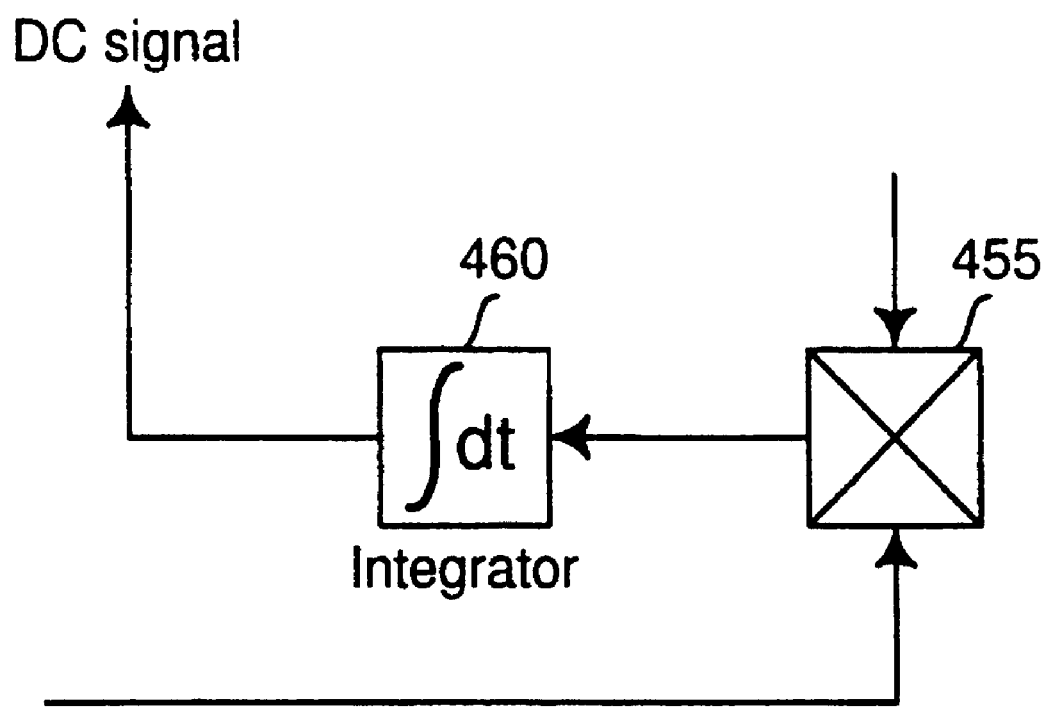
FIG. 12 is a block diagram of a feedback control circuit for use in the circuit of FIG. 11.

FIG. 12 shows one implementation of the automatic control mechanism in which a detection mixer 455 receives at one input the sample of the output signal and at another input the reference input signal. The detection mixer outputs a signal containing components across a range of frequencies. However, the output of the detection mixer of interest is the DC signal component, which provides a measure of the overlap of the unwanted input signal energy in the output with the reference input signal. This DC output is isolated from the other signal components in the detection mixer output by integration of the output in the integrator 460. The integrator has a time constant long enough to remove the unwanted non-DC signal components but short enough to provide millisecond response in the feedback. The DC output of the integrator provides the DC signal for injection into the adder 435.

A drawback with this control mechanism is that the detection mixer and the integrator may generate DC offset signals which become dominant over the feed back control DC signals. This typically occurs when the level of rejection of the input energy is in the order of 10–5 dB. It is possible to use more accurate mixers and integrators to achieve lower DC offsets to counteract this effect. However, mixers and integrators of this kind tend to be rarer and more expensive.

Figure 13:
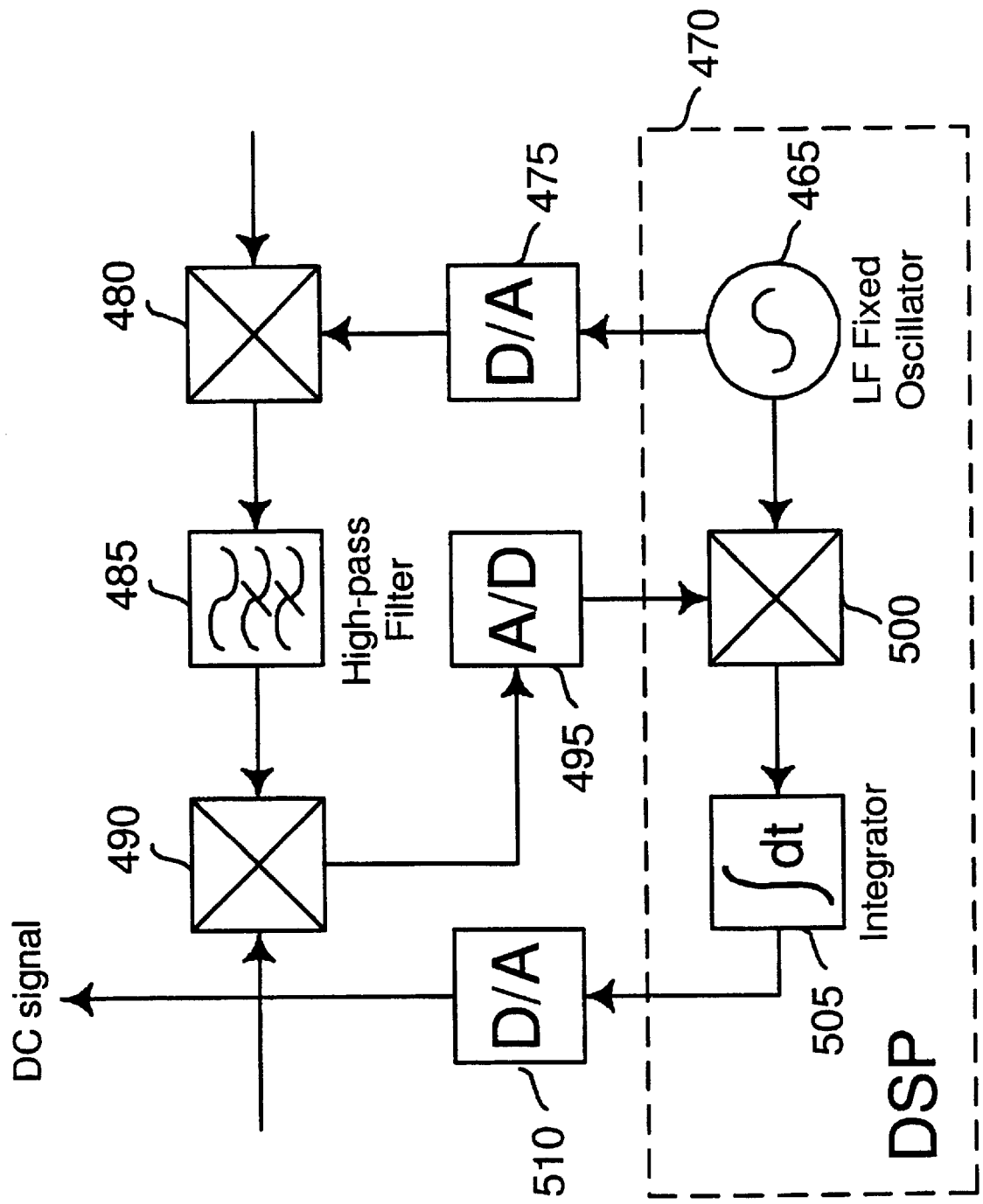
FIG. 13 is a block diagram of an enhanced feedback control circuit using digital signal processing techniques for use in the circuit of FIG. 11.

FIG. 13 shows a modified automatic control mechanism which incorporates offset frequency and digital signal processing (DSP) techniques to eliminate the DC offset problem referred to above. Although the circuit is more complex than the circuit of FIG. 12, integration of the non-DSP components on an application specific integrated circuit (ASIC) chip means that the higher component count should not add significantly to the cost of this solution. The automatic control mechanism includes the same two inputs and one output as the circuit of FIG. 12, and operates as follows. A low frequency (LF) fixed oscillator 465 operating in the digital domain of a digital signal processor (DSP) 470 provides via a digital-to-analogue converter 475 a low frequency tone signal to an input of a mixer 480. The LF tone signal is ideally at an audio frequency fLF of between 1 to 5 kHz. The second input to the mixer 480 is the output sample supplied by the splitter 450 shown in FIG. 11, and contains signal components at a relatively higher frequency than the LF tone signal, e.g. between 500 and 2000 MHz. The effect of mixing the output sample with the LF tone signal is to generate an image of the output sample shifted down in frequency by fLF and an image of the output sample shifted up in frequency by fLF. The output of the mixer 480 is processed by a high pass filter 485 which has a cut-off frequency chosen such that the filter 485 removes any LF tone signal leaking through the mixer 480. The frequency offset output sample is then fed into an input of a detection mixer 490, whilst a second input receives the reference RF input signal. As in the mechanism of FIG. 12, the detection mixer 490 provides at its output a signal containing components across a range of frequencies. However, in this mechanism it is the signal component at the tone frequency fLF which provides a measure of the overlap of the unwanted input signal energy in the output with the reference input signal.

After converting the output of the detection mixer 490 back into the digital domain of the digital signal processing (DSP) using the analogue-to-digital converter 495, the signal is fed into a digital mixer 500. It should be noted that the digital signal processor and the analogue-to digital converter are ideally suited to dealing with signals at audio frequency and can therefore accurately process the required signal component at the tone frequency fLF. The digital mixer 500 mixes the output of the detection mixer 490 with the LF tone signal from the LF fixed oscillator 465 to convert the required signal component also at the tone frequency to a DC signal. As in the mechanism of FIG. 12, this DC signal is isolated from the other signal components produced in the detection mixer by integration of the digital mixer output in a digital integrator 505. However, unlike the mechanism of FIG. 12, this offset-frequency mechanism is immune to any build up of spurious DC signals in the analogue domain, i.e. in the mixers 480, 490, the D/A 475, the A/D 495 and the high-pass filter 485. The potentially damaging DC signals enter the digital signal processor via the analogue to digital converter (A/D) 495, but are immediately converted to the tone signal frequency fLF by the digital mixer 500 and are subsequently cancelled in the integrator 505. Because the digital mixer 500 and the integrator 505 both operate in the digital domain of the digital signal processor (DSP) they do not experience the problems of their analogue counterparts such as signal leakage or spurious DC offset generation due to temperature or power supply fluctuations. The DC signal output from the integrator provides via the digital-to-analogue converter 510 the DC signal for injection into the adder 435 of FIG. 11.

Figure 14:
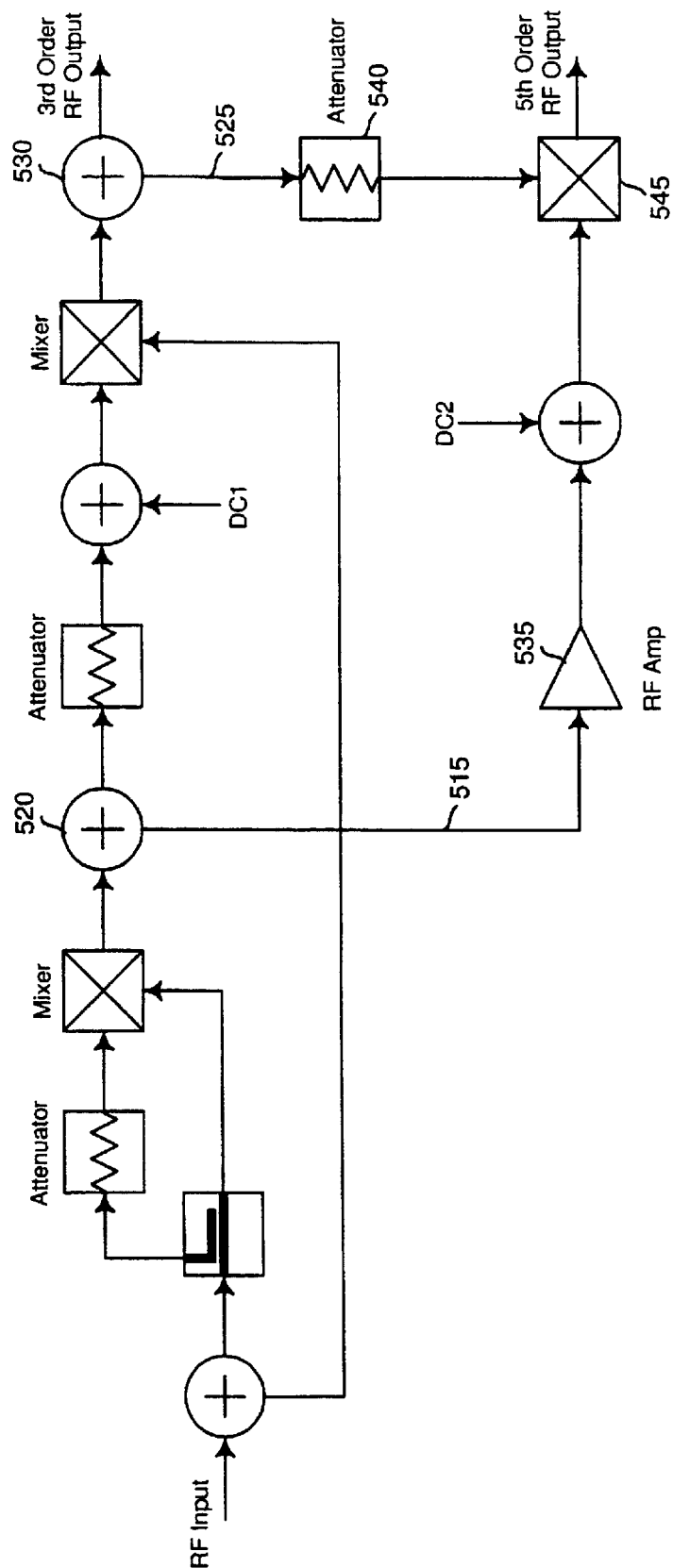
FIG. 14 is a block diagram of circuit for generating third and fifth order distortion components suitable for use in the polynomial predistorters of FIGS. 1 to 6.
Figure 15:
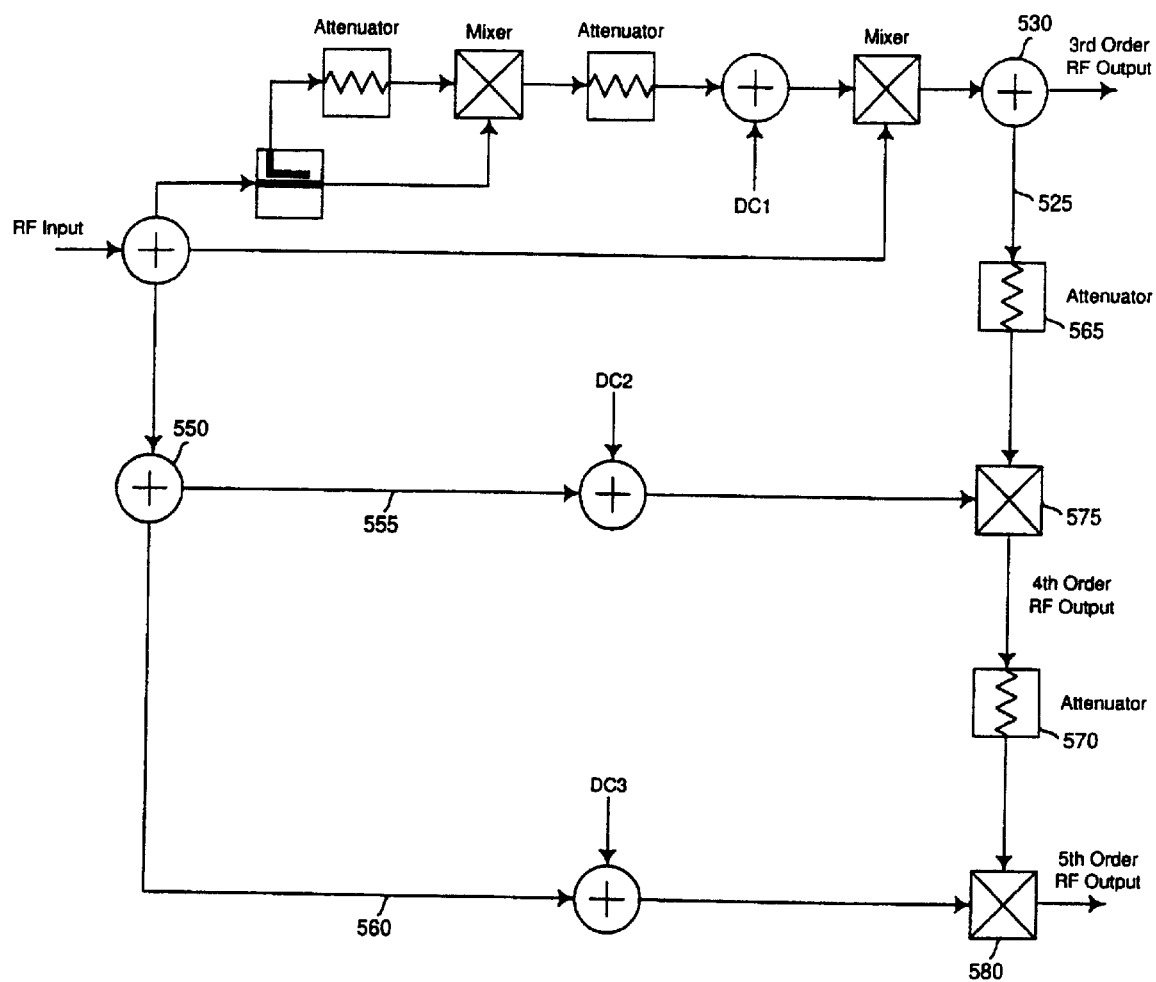
FIG. 15 is a block diagram of alternative circuit for generating third and fifth order distortion components suitable for use in the polynomial predistorters of FIGS. 1 to 6.

FIGS. 14 and 15 are block diagrams of two alternative embodiments of a circuit for generating third and fifth order distortion components, and are based on the design and basic principles of operation of the third order generation circuit of FIG. 11. Like components have therefore been labelled with like references.

In the generation circuit of FIG. 14, the second order signal is divided into a second path 515 by a splitter 520, and the third order signal is divided into a second path 525 by a splitter 530. The second order signal level on the path 515, and the third order signal level on the path 525, are adjusted by an RF amplifier 535 and an attenuator 540 respectively. The adjusted second and third order signals are then mixed in the mixer 545 to produce a fifth order RF output. A second DC injection signal is added to the second order signal path 515 for mixing with the third order signal on the path 525. By adjusting the second DC signal to a suitable level, the third order signals, which would otherwise be present in the fifth order RF output, may be cancelled.

In the generation circuit of FIG. 15, the RF input signal is further divided by a splitter 550 into paths 555 and 560, and the third order signal is divided by a splitter 530 into a path 525. The third order signal is suitably attenuated by attenuators 565 and 570 which in turn feed the mixers 575 and 580. The mixers 575 and 580 mix the third order signal with the RF input signals on the paths 555 and 560 respectively. The output of the first mixer 575 generates a fourth order signal, and the output of the second mixer 580 generates the fifth order distortion signal for outputting.

Simulations performed on the generation circuit of FIG. 14 have shown that for fifth order distortion generation the first DC injection (DCI) to the adder 435 may not be required. The third DC injection can provide significant cancellation of both the main signal energy and the third order energy leaving only the desired fifth order distortion. Removal of the first and second DC injections allow for simpler control of the fifth order distortion generation, however, a drawback in this solution is that the third order output no longer contains a pure third order distortion signal.

Figure 16:
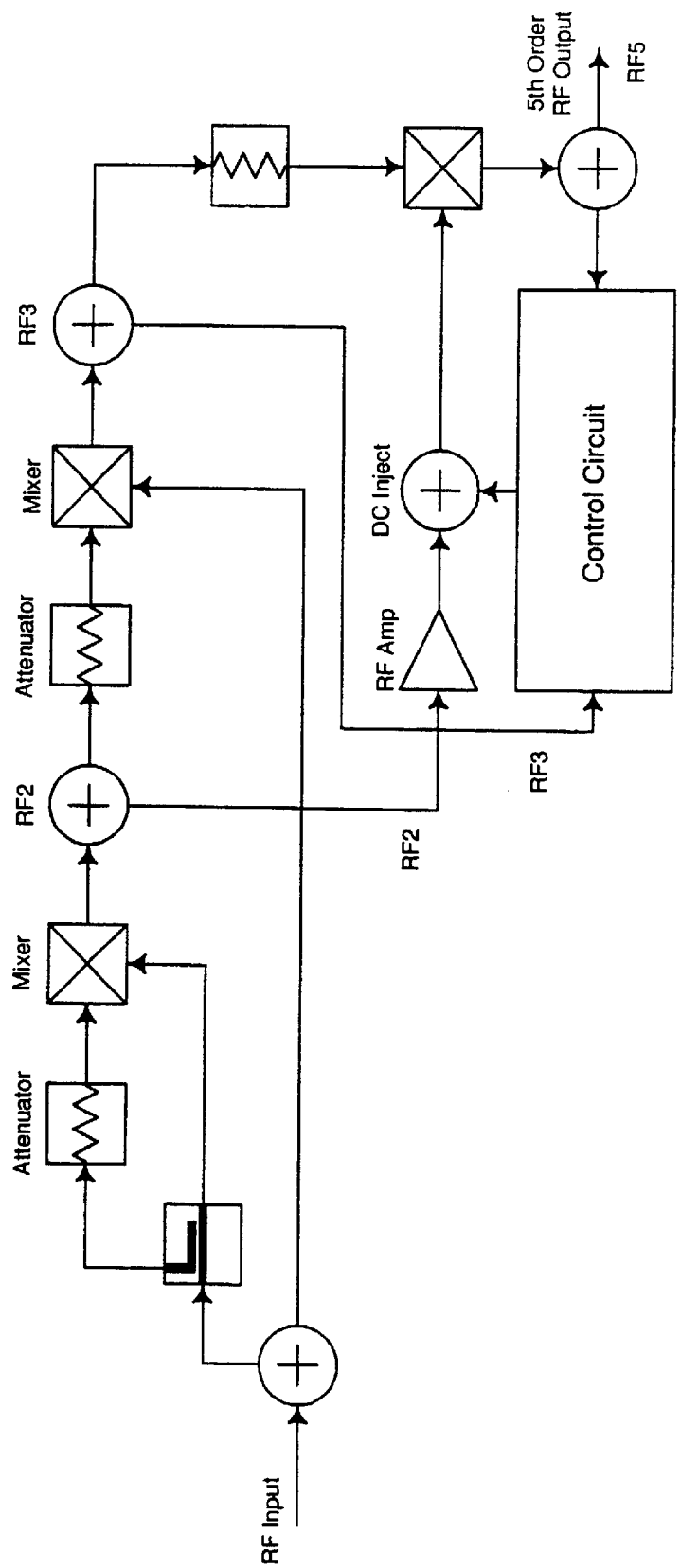
FIG. 16 is a block diagram of a circuit for generating a fifth order distortion component, based on the circuit of FIG. 14 and including a feedback control circuit.

FIG. 16 shows the circuit of FIG. 14 with a feedback control mechanism which controls and maintains the second DC injection to the adder. This feedback control mechanism performs in a similar way as in the third order generation circuit, except that a sample of the fifth order output is compared with a reference signal sampled from the third order output. The feedback DC signal therefore provides a measure of the overlap of both the unwanted input signal energy and third order signal energy in the fifth order output. The feedback control mechanism may be implemented using the feedback circuits of FIGS. 12 or 13.

Figure 17:
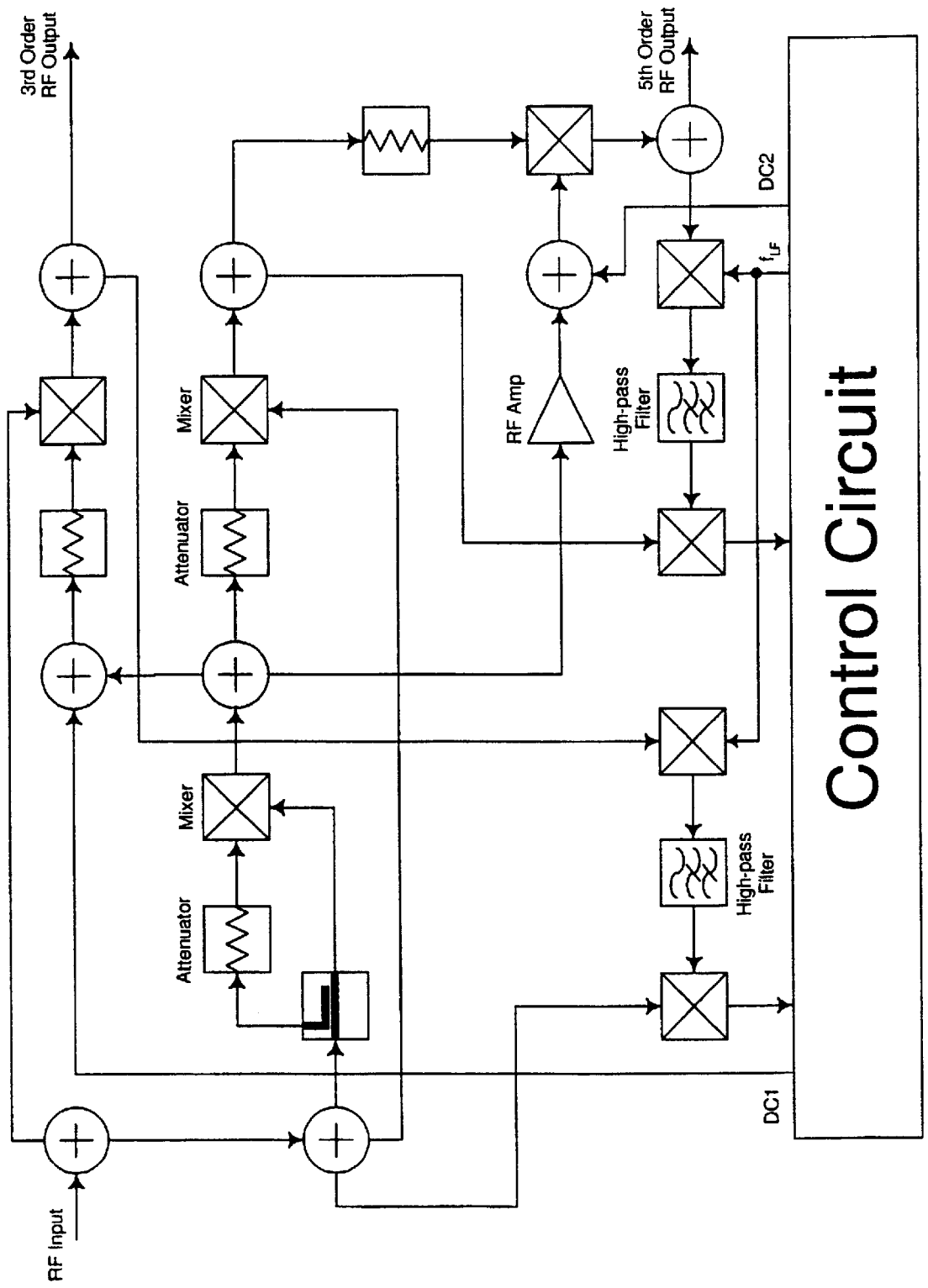
FIG. 17 is a block diagram of a circuit for generating third and fifth order distortion components, based on the circuits of FIG. 11 and FIG. 16 and including a feedback control circuit.
Figure 18:
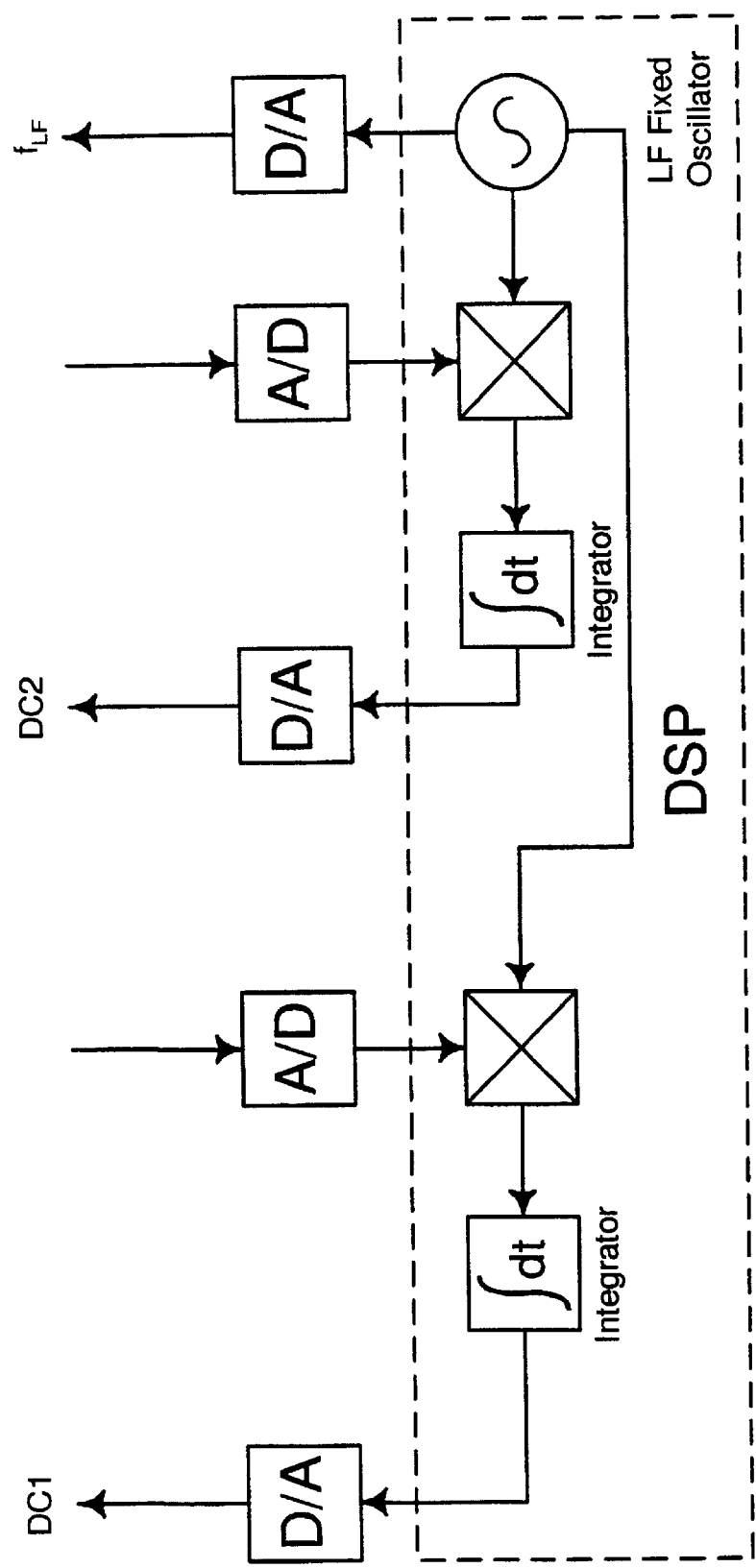
FIG. 18 is a block diagram of a feedback control circuit for use in the circuit of FIG. 17, based on the circuit of FIG. 13.

FIG. 17 is a block diagram showing a third order and a fifth order distortion generation circuit with a combined control. The circuit is a combination of the third order generation circuit of FIG. 11 and the fifth order generation circuit of FIG. 16. The combined feedback control mechanism for this circuit is shown in FIG. 18 and is based on the offset frequency mechanism of FIG. 13.

Figure 19:
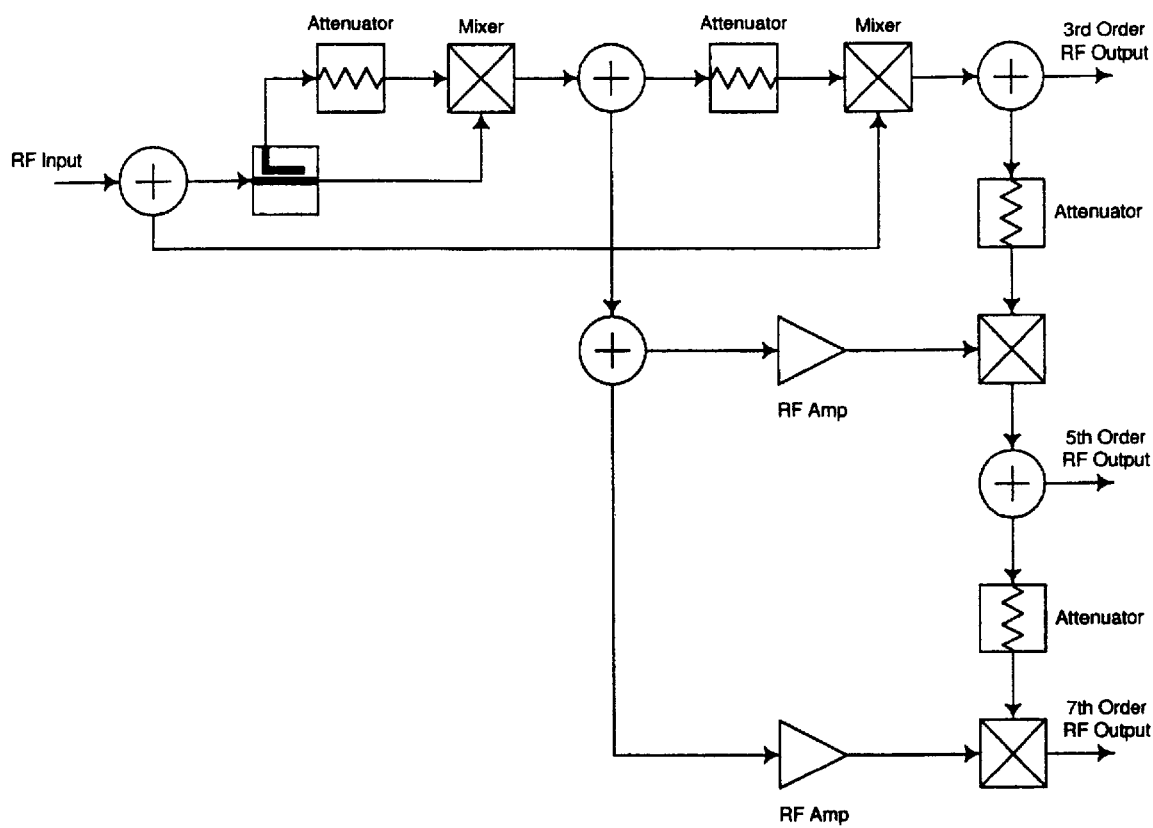
FIG. 19 is a block diagram of circuit for generating third, fifth and seventh order distortion components.
Figure 20:
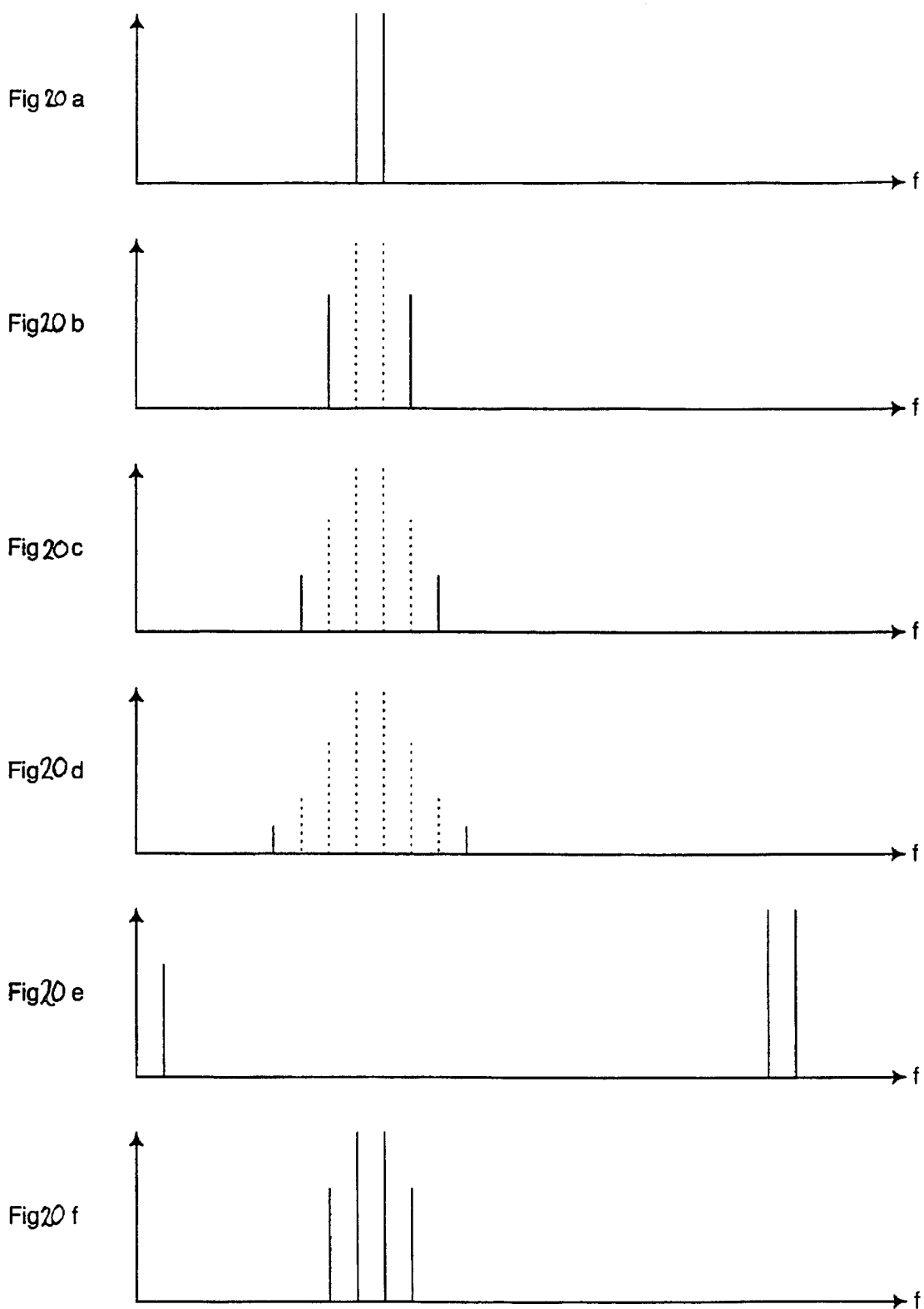
FIGS. 20a, 20b, 20c, 20d, 20e, 20f are frequency spectra for signals occurring at various points in the circuits of FIGS. 1 to 6 and 11 to 19 in operation.

FIG. 19 is a block diagram showing a circuit for generating a seventh order distortion signal based on the principle used in the fifth order generation circuit of FIG. 14. The fifth order signal is combined with the second order signal to generate a seventh order distortion output. Similar DC injection and control mechanisms to those described above may also be used with this system to enable the generation of only seventh order IMD products (ie. without the original input signals, or third or fifth order products).

Predistorter Control Mechanism

Figure 21:
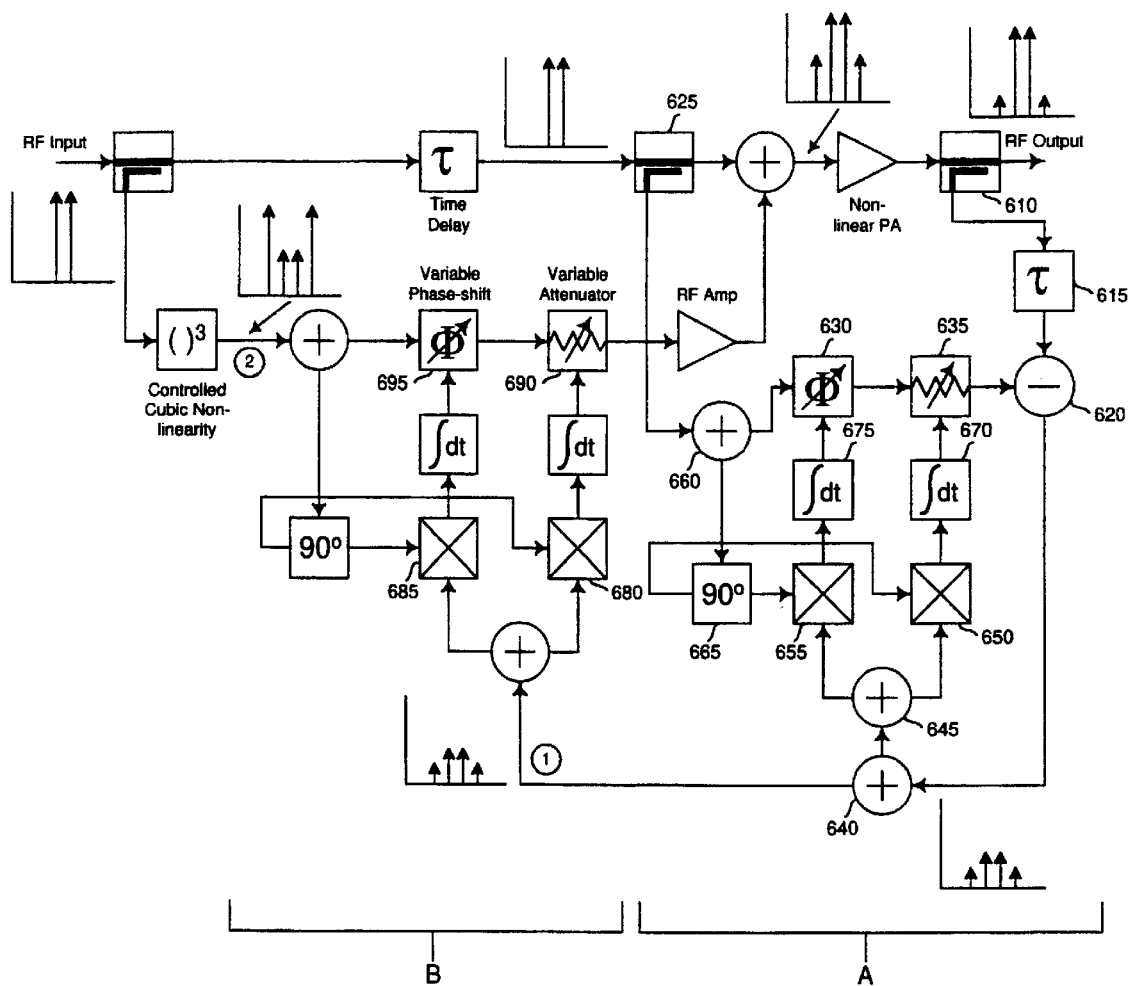
FIG. 21 is a block diagram of the scalar predistorter of FIG. 1, modified to include a predistorter control circuit.

Referring to FIG. 21, there is shown the scalar predistorter of FIG. 1 modified to include a predistorter control circuit. For simplicity, only the third order distortion path of the scalar predistorter is shown together with a relevant third order predistorter control circuit. It is apparent however that the predistorter control circuit may be extended to provide discrete control of all the distortion paths of the scalar predistorter, ie third, fifth, and seventh order, as will be shown.

The predistorter control mechanism involves two stages (labelled A and B in FIG. 21). Stage A comprises sampling the main RF power amplifier output and removing in a controlled sense a substantial amount of the main signal energy to form a signal which contains a relatively high proportion of amplifier generated distortion components (ie an error signal). Stage B comprises correlating this error signal with the output of a distortion generator of a particular order so as to create a control signal representative of the amount of residual intermodulation distortion of that particular order remaining in the output spectrum. The correlation of stage B can take place in separate I and Q channels to provide independent control for the phase and amplitude of the subtraction process.

Stage A of the predistorter control circuit shown in FIG. 21 operates as follows. A sample of the RF power amplifier (PA) output is obtained by the directional coupler 610 and is fed via a time delay component 615 to the non-inverting input of the subtractor 620. A signal corresponding to the RF input is applied to the inverting input of the subtractor 620 at an appropriate amplitude and phase to remove or cancel the main signal energy in the PA output sample. This cancelling signal is derived from the main signal path of the predistorter by a directional coupler 625, and is supplied to the subtractor 620 via a variable phase-shift component 630 and a variable attenuator 635 which provide the appropriate amplitude and phase adjustments. The time delay component 615 ensures that the two input signals to the subtractor 620 coincide.

The process of removing or cancelling the main signal in the PA output sample is dependent on an accurate control of the variable phase shift component 630 and variable attenuator 635 respectively. Therefore stage A includes a feedback control loop which comprises two splitters 640 and 645 coupled to the output of the subtractor 620 and arranged in series to supply the error signal to two quadrature mixers 650 and 655. A splitter 660 supplies the cancelling signal (before phase and amplitude adjustment) to a phase quadrature component 665 which in turn operates to supply an in-phase version of the cancelling signal to a second input of the mixer 650 and a quadrature phase version of the cancelling signal to a second input of the mixer 655. The output of the mixer 650 contains, in addition to unwanted frequency components, a DC signal which represents the projection of the main signal energy (contained in the error signal) on the in-phase version of the cancelling signal. In contrast, the output of the mixer 655 contains, in addition to unwanted frequency components, a DC signal which represents the projection of the main signal energy (contained in the error signal) on the quadrature phase version of the cancelling signal. The unwanted frequency components output from the mixers 650 and 655 are cancelled in the integrators 670 and 675 respectively to generate two smoothed DC control signal for respectively controlling the variable attenuator 635 and the variable phase-shift component 630.

The DC signals from the mixers 650 and 655 will vary as the feedback loop adjusts the phase and amplitude of the cancellation signal to minimise the main signal energy in the error signal. The feedback loop will eventually reach a steady state whereby any deviation of the main signal energy from the minimum will result in a corresponding adjustment to counteract the change.

Stage B of the predistorter control circuit operates using a similar principle and circuitry as the feedback circuit of stage A. However, instead of correlating the residual main signal energy in the error signal with a reference RF input signal derived from the main signal path of the predistorter, stage B correlates a particular order of the intermodulation distortion (IMD) present in the error signal with a reference distortion signal of the same order. Therefore, in the third order example shown in FIG. 21, the DC signals output from the stage B mixers 680 and 685 will contain, in addition to unwanted frequency components, a DC signal which represents the projection of the residual third order distortion (contained in the error signal) on either the in-phase or the quadrature version of the third order reference distortion signal. The reference distortion signal is advantageously derived from the appropriate distortion generator in the distortion path of the predistorter.

Figure 22:
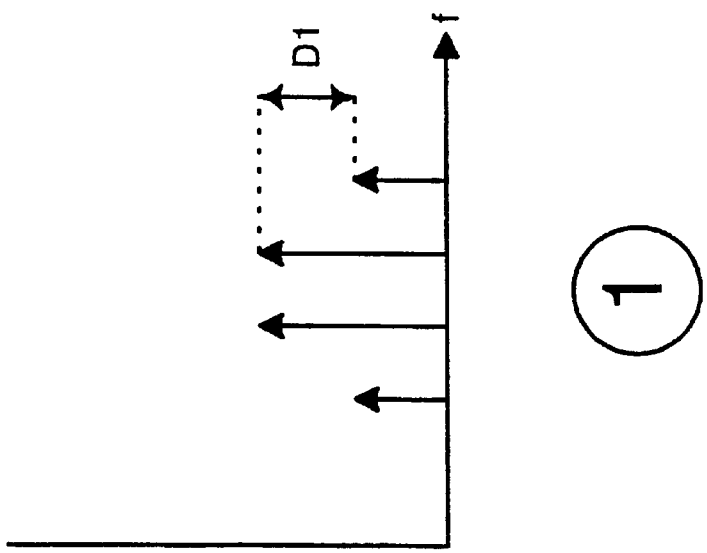
FIG. 22 illustrates two frequency spectra which correspond to an error signal at point (1) and a reference third order distortion signal at point (2) in FIG. 21.
Figure 22:
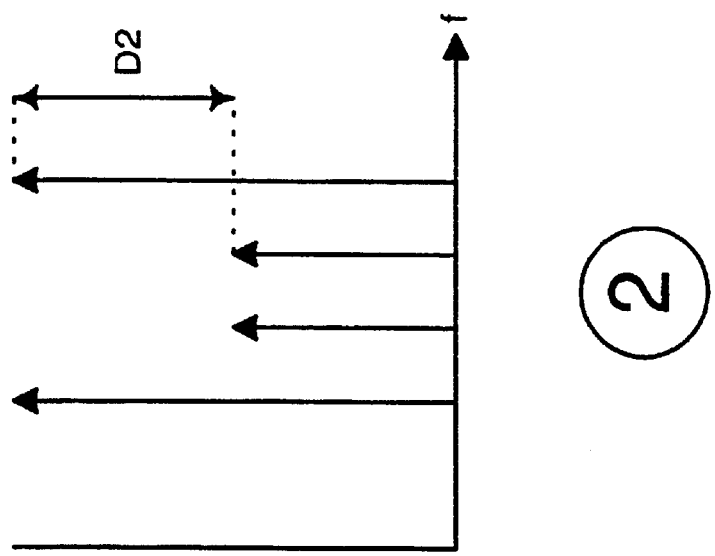

FIG. 22 illustrates two frequency spectra which correspond to the error signal at point (1) in FIG. 21, and the reference third order distortion signal at point (2) in FIG. 21. It can be seen that both signals are contaminated with main signal energy which will correlate in the mixer 680 and 685 of stage B to generate an additional undesirable DC signal at the mixer outputs. Clearly this undesirable DC signal must be at a sufficiently low level in order not to interfere with the desired third order dependent DC signal used to adjust the variable phase shift component 690 and the variable attenuator 695. Therefore, the main signal removal processes which occur in the third order predistorter generator and in stage A of the predistorter control circuit should ideally operate such that the third order energy dominates in the correlation of stage B. Suitably, the values D1 and D2 in FIG. 22 should satisfy the following equation:

$$D1-D2 < -10 \text{ dB}$$

Figure 23:
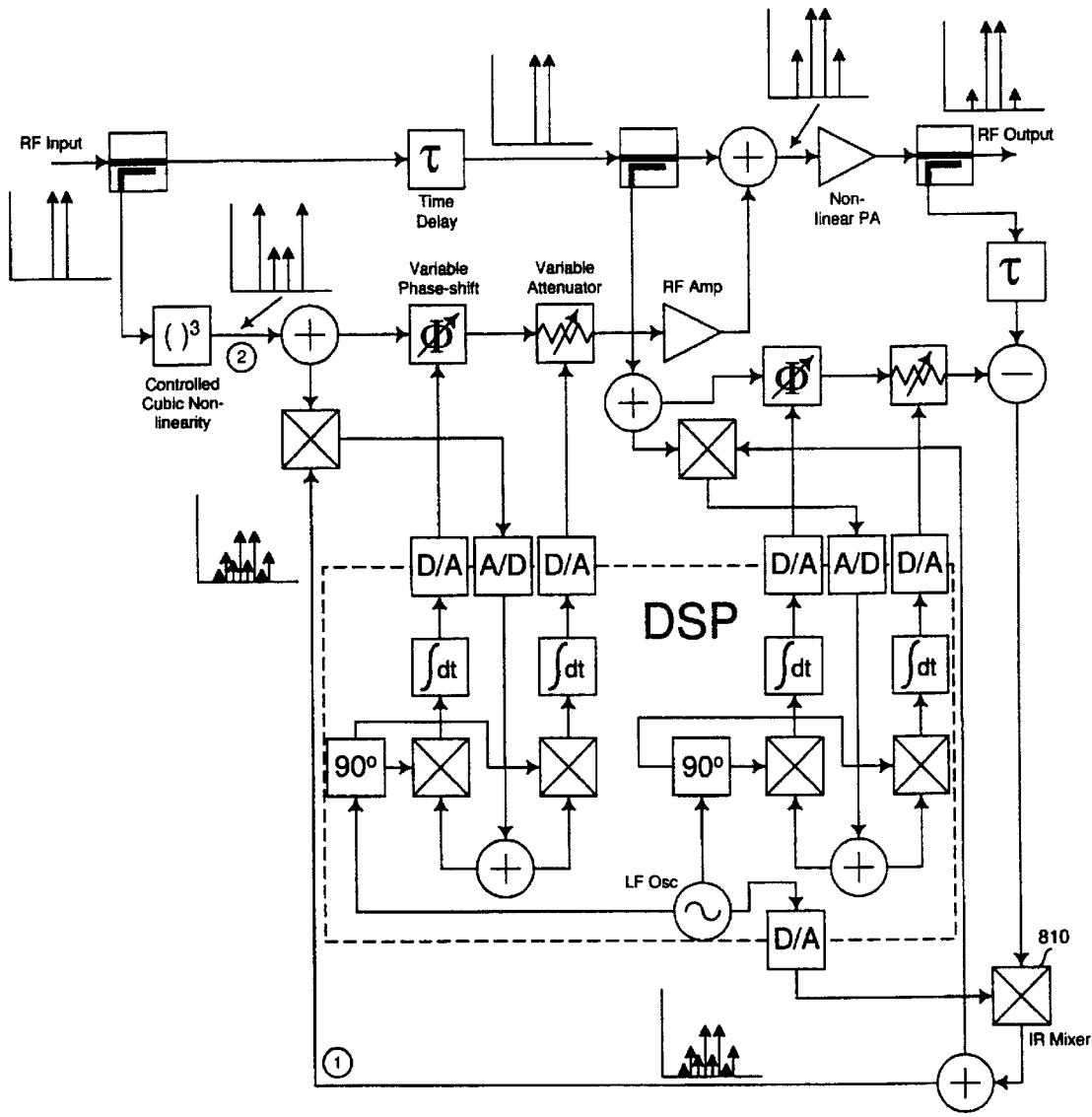
FIG. 23 is a block diagram showing the controlled predistorter of FIG. 21, modified to take advantage of a digital signal processor (DSP)

FIG. 23 shows the controlled predistorter of FIG. 21 modified to take advantage of a digital signal processor (DSP). The benefit of this arrangement is that the offset-frequency technique, described previously with reference to the distortion generation circuits, can be implement in the DSP to eliminate the problems of DC-offsets and temperature drift associated with analogue mixers and integrators. It should be noted however that because the predistorter control circuit is phase dependent, the mixer 810 must be an image reject mixer in order to retain the phase information in the control signals.

Figure 24:
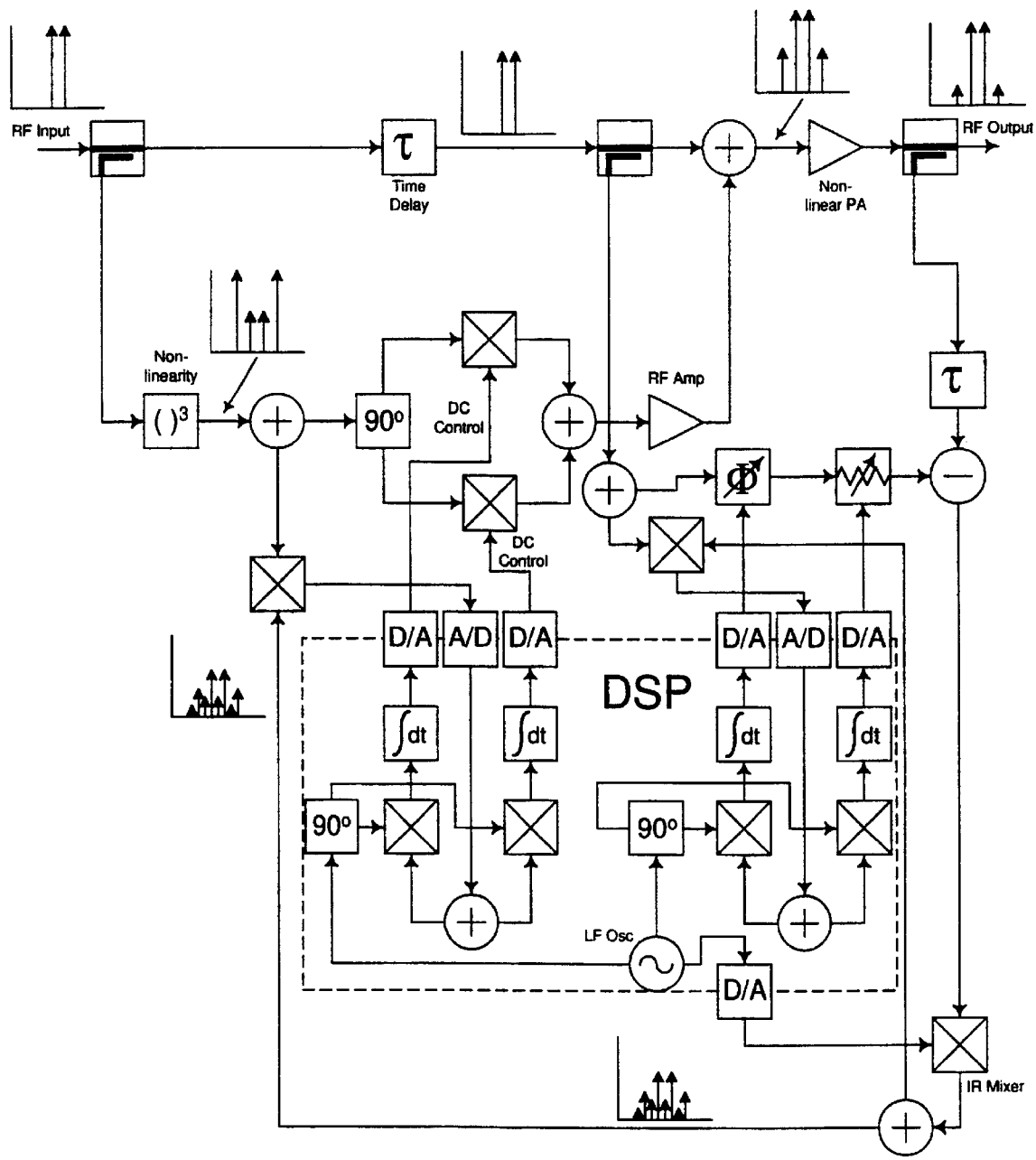
FIG. 24 is a block diagram showing a predistorter control circuit used to control a third order vector predistorter.

In FIG. 24, the predistorter control circuit is used to control a third order vector predistorter. In this embodiment, the in-phase (I) DC control signal and the quadrature (Q) DC control signal in stage B are used to directly control the corresponding I and Q channel mixers or multipliers in the appropriate distortion path of the predistorter.

Figure 6:
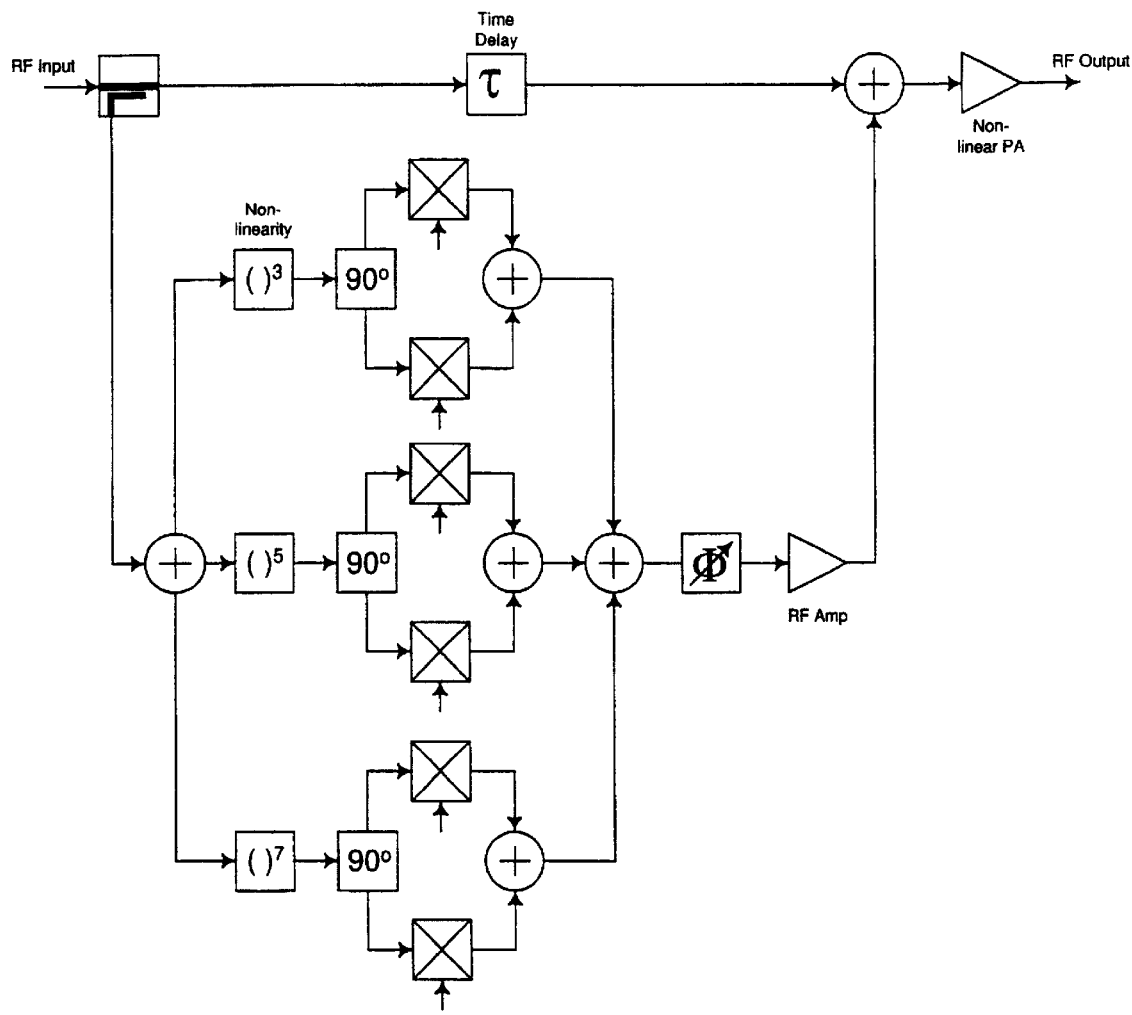
Figure 25:
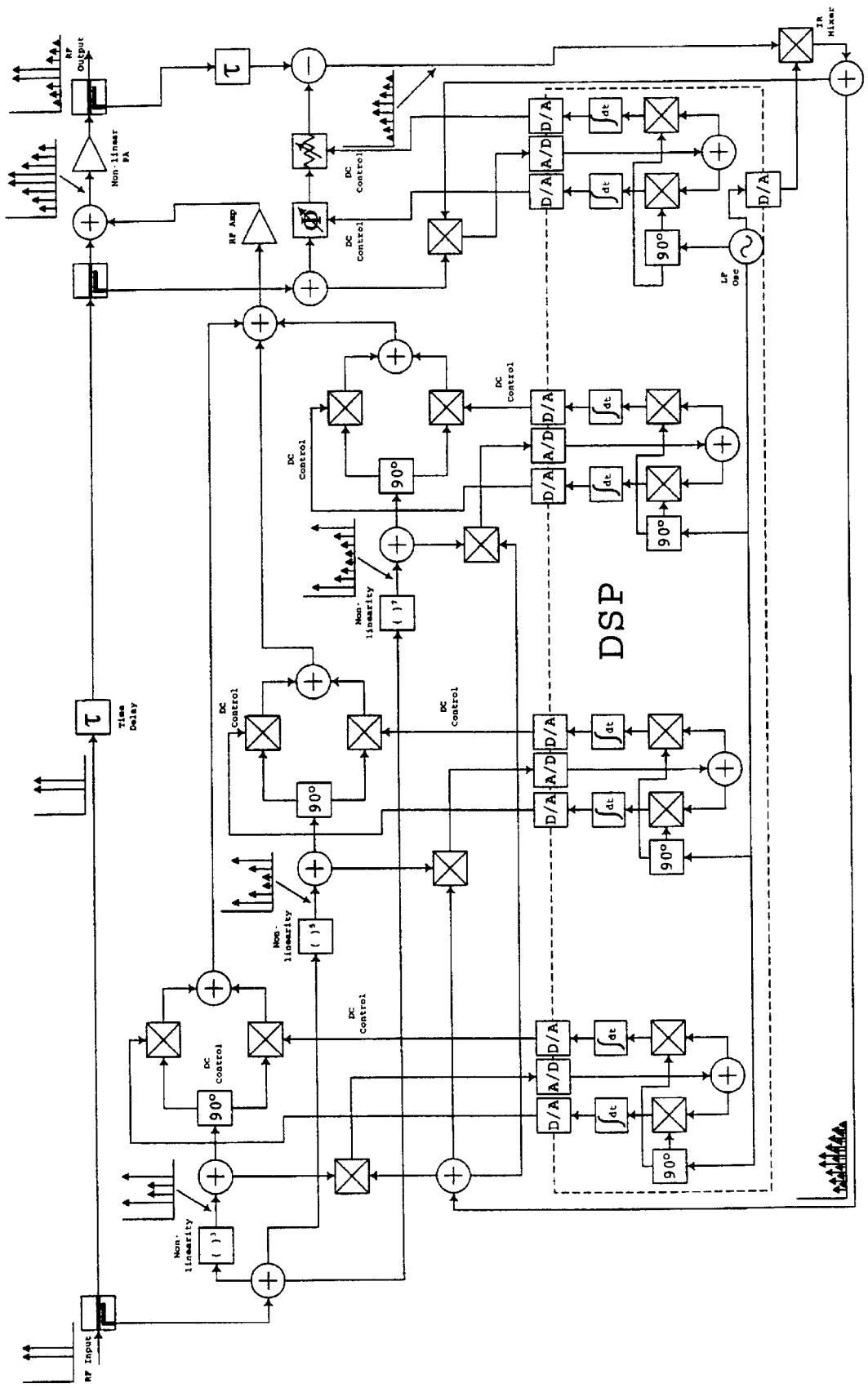
FIG. 25 is a block diagram showing a predistorter control circuit applied to the multi order vector predistorter of FIG. 6.

FIG. 25 shows a predistorter control circuit applied to the multi order vector predistorter of FIG. 6. In this arrangement, the stage B correlation process for fifth and seventh order control must also dominate over the contaminating lower order and main signal correlation processes, based on similar criteria as in the stage B correlation for third order discussed previously.

Figure 26:
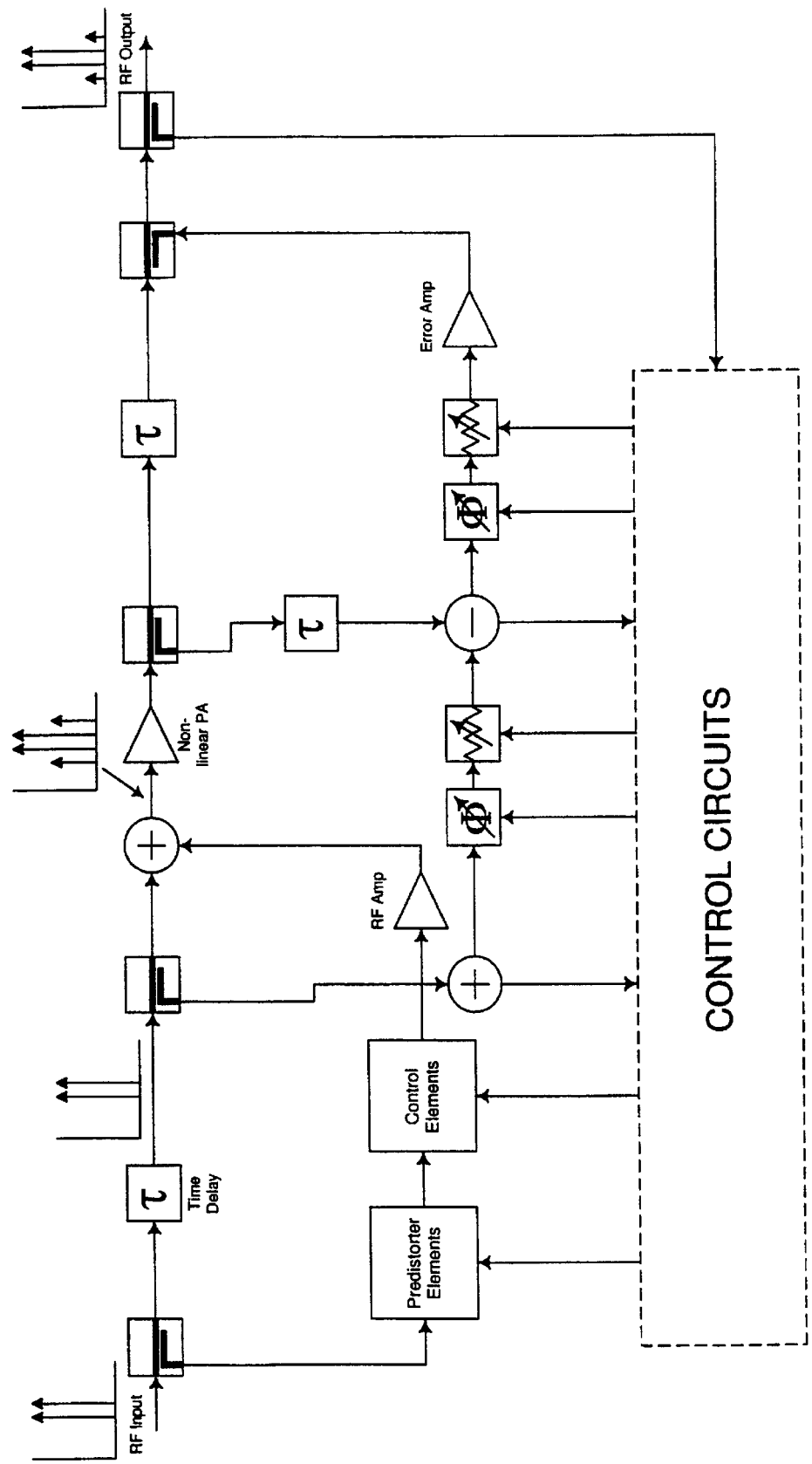
FIG. 26 is a block diagram of a combined predistorter and feedforward amplifier arrangement.

The feedforward linearisation technique referred to in the introduction can be applied to the RF power amplifier in addition to the predistorter linearisation techniques described in the aforementioned embodiments. In this case, the predistorter control circuits shown in FIGS. 21, 23, 24 and 25 can provide a further surprising advantage that the error signal generated in stage A can be used as an error signal in the feedforward system. FIG. 26 shows a block diagram of a combined predistorter and feedforward amplifier arrangement. Control of the feedforward system, specifically the error cancellation loop, can be provided in a number of known ways independently of the predistorter control.

It will be evident in view of the foregoing that various modifications may be made within the scope of the present invention. For example, the description refers to the use of certain components such as mixers and integrators which could be replaced by multipliers and low-pass filters respectively.

What is claimed is:

1. A predistorter arrangement for linearising an amplifier, the predistorter arrangement comprising an input signal path for receiving an input signal which is required to be amplified, a distortion path in which the input signal from the input signal path is processed to generate a distortion signal comprising at least one distortion component which is a third order or higher order component of the input signal, a combiner for combining the distortion signal with the input signal in the input signal path to produce a predistorted input signal which is supplied to the amplifier input, and an error corrector in which the amplifier output signal is compared with the distortion signal from the distortation path to produce error correction signals for controlling the generation of at least one distortion component in the distortion path, wherein, for each distortion component for which an error correction signal is produced, the error corrector compares the distortion component individually with the amplifier output signal to produce the error correction signal for controlling the generation of that distortion component.

2. A predistorter arrangement as claimed in claim 1, wherein the comparison performed by the error corrector comprises subtracting the input signal from the amplifier output signal to generate an input signal subtracted amplifier output signal.

3. A predistorter arrangement as claimed in claim 2, wherein the error corrector includes a controller in which the input signal subtracted amplifier output signal is frequency translated by an oscillator signal, then correlated with the input signal, and thereafter processed in a digital signal processor using the oscillator signal to produce a control signal for controlling the subtraction of the input signal from the amplifier output signal.

4. A predistorter arrangement as claimed in claim 2, wherein the error corrector supplies the input signal subtracted amplifier output signal to a feed forward arrangement.

5. A predistorter arrangement as claimed in claim 1, wherein the distortion path includes an adjuster for adjusting the distortion signal in dependence on the error correction signal.

6. A predistorter arrangement as claimed in claim 5, wherein the adjuster enables adjustment of the distortion signal in phase and amplitude.

7. A predistorter arrangement as claimed in claim 6, wherein the adjuster comprises a variable phase shifter and a variable attenuator.

8. A predistorter arrangement as claimed in claim 6, wherein the adjuster comprises an in-phase adjuster and a quadrature phase adjuster.

9. A predistorter arrangement as claimed in claim 1, wherein the error corrector correlates the amplifier output signal with the distortion signal to produce the error correction signal.

10. A predistorter arrangement as claimed in claim 1, wherein the distortion path processes the input signal to generate a first distortion component which is a third order or higher order component of the input signal.

11. A predistorter arrangement as claimed in claim 10, wherein the error corrector compares the amplifier output signal with the first distortion component from the distortion path to produce a first error correction signal for controlling the generation of the first distortion component in the distortion path.

12. A predistorter arrangement as claimed in claim 10, wherein the distortion path processes the input signal to generate a second distortion component which is a different third order or higher order component of the input signal.

13. A predistorter arrangement as claimed in claim 12, wherein the error corrector compares the amplifier output signal with the second distortion component from the distortion path to produce a second error correction signal for controlling the generation of the second distortion component in the distortion path.

14. The combination of a predistorter arrangement as claimed in claim 3 and a feed forward arrangement for linearising an amplifier, in which the input signal subtracted amplifier output signal is utilised by the feed forward arrangement.

15. A method for linearising an amplifier, including a distortion step in which an input signal which is required to be amplified is processed to generate a distortion signal comprising at least one distortion component which is a third order or higher component of the input signal, a combining step in which the distortion signal is combined with the input signal to produce a predistorted input signal which is supplied to the amplifier input, and an error correction step in which the amplifier output signal is compared with the distortion signal to produce error correction signals which control the generation of at least one distortion component in the distortion step, wherein for each distortion component for which an error correction signal is produced, the error correction step comprises comparing the distortion component individually with the amplifier output signal to produce an error correction signal for controlling the generation of that distortion component.

* * * * *